(12) United States Patent
Gulani et al.

(10) Patent No.: US 10,345,414 B2
(45) Date of Patent: Jul. 9, 2019

(54) RAPID QUANTITATIVE ABDOMINAL IMAGING WITH MAGNETIC RESONANCE FINGERPRINTING (MRF)

(71) Applicant: Case Western Reserve University, Cleveland, OH (US)

(72) Inventors: Vikas Gulani, Shaker Heights, OH (US); Yong Chen, Beachwood, OH (US); Nicole Seiberlich, Cleveland Heights, OH (US); Mark Griswold, Shaker Heights, OH (US)

(73) Assignee: Case Western Reserve University, Cleveland, OH (US)

( * ) Notice: Subject to any disclaimer, the term of this patent is extended or adjusted under 35 U.S.C. 154(b) by 873 days.

(21) Appl. No.: 14/746,575

(22) Filed: Jun. 22, 2015

(65) Prior Publication Data

US 2016/0282430 A1    Sep. 29, 2016

Related U.S. Application Data

(60) Provisional application No. 62/137,286, filed on Mar. 24, 2015.

(51) Int. Cl.
 *G06N 3/08* (2006.01)
 *G01R 33/561* (2006.01)
 (Continued)

(52) U.S. Cl.
 CPC ..... *G01R 33/5613* (2013.01); *G01R 33/4828* (2013.01); *G01R 33/50* (2013.01); *G01R 33/5659* (2013.01)

(58) Field of Classification Search
 USPC .......... 324/300–322; 600/407–435; 382/128–131
 See application file for complete search history.

(56) References Cited

U.S. PATENT DOCUMENTS

| 4,833,434 A | * | 5/1989 | Takechi | G01R 33/3815 324/318 |
| 9,640,070 B2 | * | 5/2017 | Griswold | G01R 33/3614 |
| | | | (Continued) | |

OTHER PUBLICATIONS

D. Ma, et al., "Magnetic Resonance Fingerprinting", Nature, Mar. 14, 2013, 187-192, 495-7440, Macmillan Publishers Limited, United States.

(Continued)

*Primary Examiner* — Patrick Assouad
*Assistant Examiner* — Taqi R Nasir
(74) *Attorney, Agent, or Firm* — Quarles & Brady LLP

(57) ABSTRACT

Example embodiments associated with characterizing a sample using NMR fingerprinting are described. One example NMR apparatus includes an NMR logic that repetitively and variably samples a (k, t, E) space associated with an object to acquire a set of NMR signals that are associated with different points in the (k, t, E) space. The NMR signals are produced in response to a FISP-MRF pulse sequence. Sampling is performed with t and/or E varying in a non-constant way. The NMR apparatus may also include a signal logic that produces an NMR signal evolution from the NMR signals and a characterization logic that characterizes a tissue in the object as a result of comparing acquired signals to reference signals. Acquired signals are corrected using data describing an inhomogeneous B1 field produced by the NMR apparatus while the set of NMR signals are acquired.

34 Claims, 23 Drawing Sheets

(51) Int. Cl.
  *G01R 33/48* (2006.01)
  *G01R 33/50* (2006.01)
  *G01R 33/565* (2006.01)

(56) References Cited

U.S. PATENT DOCUMENTS

| | | | |
|---|---|---|---|
| 9,916,823 B2* | 3/2018 | Griswold | G10H 3/12 |
| 2004/0169511 A1* | 9/2004 | Minh | G01N 24/081 |
| | | | 324/303 |
| 2005/0215882 A1* | 9/2005 | Chenevert | A61B 5/055 |
| | | | 600/410 |
| 2014/0167754 A1* | 6/2014 | Jerecic | G01R 33/561 |
| | | | 324/309 |
| 2015/0070012 A1* | 3/2015 | Griswold | G01R 33/283 |
| | | | 324/309 |
| 2015/0130460 A1* | 5/2015 | Valori | G01N 24/081 |
| | | | 324/309 |
| 2015/0301138 A1* | 10/2015 | Griswold | G01R 33/56563 |
| | | | 324/309 |
| 2015/0302297 A1* | 10/2015 | Griswold | G01R 33/5608 |
| | | | 706/23 |
| 2015/0302842 A1* | 10/2015 | Griswold | G10H 3/12 |
| | | | 84/604 |

OTHER PUBLICATIONS

Da Bazelaire Cm J et al., MR Imaging Relaxation Time of Abdominal and Pelvic tissues Measured in Vivo at 3.0 T: Preliminary Results, Radiology, Mar. 1, 2004, 652-259, 230-3, Radiology Society of North America, United States and Canada.

Doneva M et al., Compressed sensing reconstruction for magnetic resonance parameter mapping, Magnetic Resonance in Medicine, Jun. 17, 2010, 1114-1120, 64-4, John Wiley & Sons Inc, United States.

B.A. Garner, Modern Legal Usage, A Dictionary of Modern Legal Usage, 1995, 624, 2, Oxford University Press, Oxford.

* cited by examiner

RAPID QUANTITATIVE ABDOMINAL IMAGING WITH MAGNETIC RESONANCE FINGERPRINTING (MRF)

CROSS REFERENCE TO RELATED APPLICATIONS

This application claims the benefit of U.S. Provisional Patent Application 62/137,286 filed Mar. 24, 2015.

FEDERAL FUNDING NOTICE

This invention was made with government support under 1RO1EB017219, 1RO1DK098503, and RO0EB011527 awarded by the National Institutes of Health (NIH). The government has certain rights in the invention.

BACKGROUND

Fast quantitative imaging of the abdomen and magnetic resonance imaging (MRI) of the abdomen continue to face several challenges. Quantitative parameter measurement in the abdomen is extremely challenging due, at least in part, to the large organs that are part of the anatomy of the abdomen. Quantitative parameter measurement in the abdomen is also challenged by field inhomogeneities, which may be significant over such a large volume. Quantitative parameter measurement in the abdomen may also be challenged by physiological motion in the volume.

Characterizing tissue species using nuclear magnetic resonance (NMR) can include identifying different properties of a resonant species (e.g., T1 spin-lattice relaxation, T2 spin-spin relaxation, proton density). Other properties like tissue types and super-position of attributes can also be identified using NMR signals. These properties and others may be identified simultaneously using magnetic resonance fingerprinting (MRF), which is described in *Magnetic Resonance Fingerprinting*, Ma D et al., Nature 2013:495, (7440): 187-192.

Conventional magnetic resonance (MR) pulse sequences include repetitive similar preparation phases, waiting phases, and acquisition phases that serially produce signals from which images can be made. The preparation phase determines when a signal can be acquired and determines the properties of the acquired signal. For example, a first pulse sequence may produce a T1-weighted signal at a first echo time (TE) while a second pulse sequence may produce a T2-weighted signal at a second TE. These conventional pulse sequences typically provide qualitative results where data are acquired with various weightings or contrasts that highlight a particular parameter (e.g., T1 relaxation, T2 relaxation).

When MR images are generated, they may be viewed by a radiologist and/or surgeon who interprets the qualitative images for specific disease signatures. The radiologist may examine multiple image types (e.g., T1-weighted, T2-weighted) acquired in multiple imaging planes to make a diagnosis. The radiologist or other individual examining the qualitative images may need particular skill to be able to assess changes from session to session, from machine to machine, and from machine configuration to machine configuration.

Unlike conventional MRI, MRF employs a series of varied sequence blocks that simultaneously produce different signal evolutions in different resonant species (e.g., tissues) to which the radio frequency (RF) is applied. The term "resonant species", as used herein, refers to an item (e.g., water, fat, tissue, material) that can be made to resonate using NMR. By way of illustration, when RF energy is applied to a volume that has different resonant tissues (e.g., normal liver tissue, cancerous lesion in liver), then both the different resonant species will produce an NMR signal. However the signal from the first resonant tissue will be different from the signal from the second resonant tissue and can be distinguished using MRF. The different signals can be collected over a period of time to identify a signal evolution for the volume. Resonant species in the volume can then be characterized by comparing the signal evolution to known evolutions. Characterizing the resonant species may include identifying a material or tissue type, or may include identifying MR parameters associated with the resonant species. The "known" evolutions may be, for example, simulated evolutions calculated from physical principles and/or previously acquired evolutions. A large set of known evolutions may be stored in a dictionary.

BRIEF DESCRIPTION OF THE DRAWINGS

The accompanying drawings, which are incorporated in and constitute a part of the specification, illustrate various example systems, methods, and other example embodiments of various aspects of the invention. It will be appreciated that the illustrated element boundaries (e.g., boxes, groups of boxes, or other shapes) in the figures represent one example of the boundaries. One of ordinary skill in the art will appreciate that in some examples one element may be designed as multiple elements or that multiple elements may be designed as one element. In some examples, an element shown as an internal component of another element may be implemented as an external component and vice versa. Furthermore, elements may not be drawn to scale.

DETAILED DESCRIPTION

Magnetic Resonance Fingerprinting (MRF) provides a new paradigm for magnetic resonance imaging (MRI) acquisition and reconstruction. MRF also provides new opportunities for quantitative analysis of acquired data. MRF facilitates rapid, efficient, and simultaneous quantification of multiple tissue properties. (See, e.g., *Magnetic Resonance Fingerprinting*, Ma D et al., Nature 2013:495, (7440):187-192). Example apparatus and methods use MRF for accurate and high-resolution quantification of multiple tissue properties in the abdomen. Example apparatus and methods may perform accurate and high-resolution quantification in a single clinically feasible breath-hold (e.g., less than 20 seconds).

Example apparatus and methods perform accurate quantification in the presence of significant B0 and B1 field inhomogeneities. Example apparatus and methods provide a rapid and robust MRF technique in combination with a fast imaging with steady-state free precession (FISP) acquisition and Bloch-Siegert B1 mapping. In one embodiment, quantitative characterization of different types of focal liver lesions may be made. Example apparatus and methods provide spatial resolution (e.g., 1.9 mm in-plane) and FOV (e.g., 44 cm) suitable for quantitative abdominal imaging. Example apparatus and methods also provide quantitative characterization of different types of focal lesions in the abdomen.

Quantitative MR measurement can provide a great deal of information about tissue properties and pathological conditions. In the abdomen, for example, mapping of T1 relaxation time has been used for functional imaging of cirrhotic versus control livers. Mapping of T1 relaxation time has also shown potential to be an imaging marker for declining renal function. Additionally, quantitative T2 mapping has significantly outperformed expert radiologists reading T2-weighted images in sensitivity, specificity, and accuracy when separating benign and malignant liver lesions. Preclinical studies also report that T2 relaxation time is highly predictive of tumor response to therapy, suggesting a potential use for early prediction of treatment effectiveness.

Figure 1:
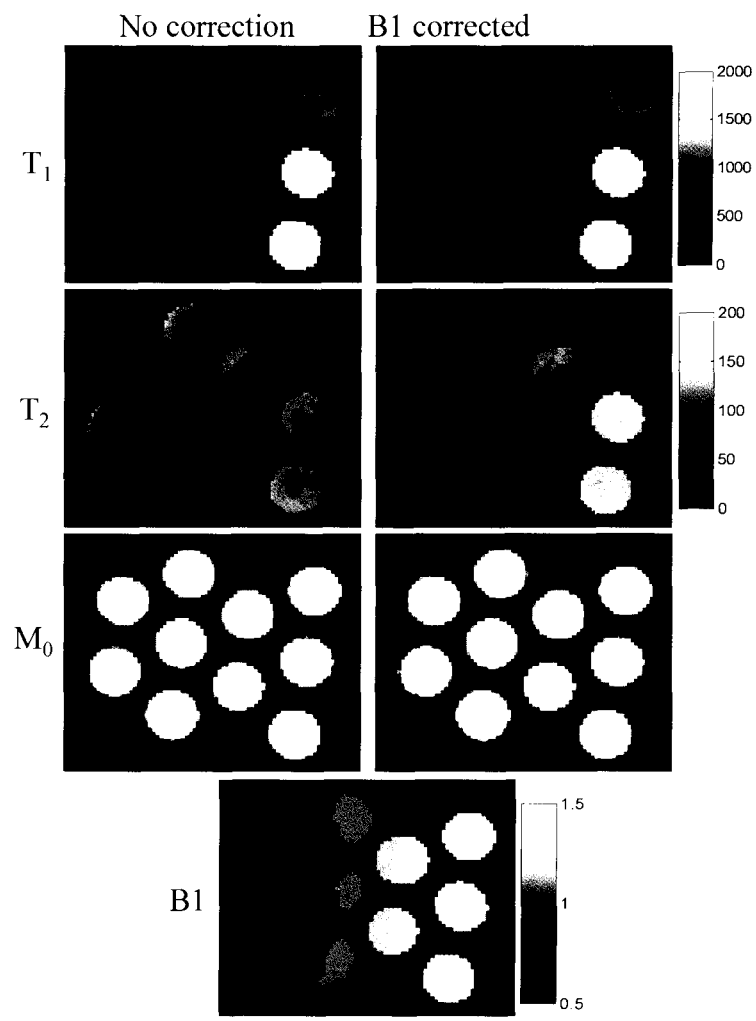
FIG. 1 illustrates T1, T2, and proton density maps acquired using an example FISP-MRF approach before and after B1 correction.

Experiments using example apparatus and methods were performed using MRF data from the abdomens of healthy volunteers. FIG. 1 illustrates T1, T2, and proton density maps acquired using FISP-MRF before and after B1 correction. FIG. 1 presents the T1, T2, and proton density maps acquired from phantom studies using the FISP-MRF method before and after B1 correction. With the additional surface coil, a maximum of 45% change in B1 magnitude was observed, which is in a similar scale as the B1 variation observed in the in-vivo measurements. Unlike conventional methods that typically show a dependence of T1 on the B1, phantom results consistently showed a dependence of T2 on B1. However, after B1 correction, both T1 and T2 values are in good agreement with values acquired using conventional methods.

Figure 2:
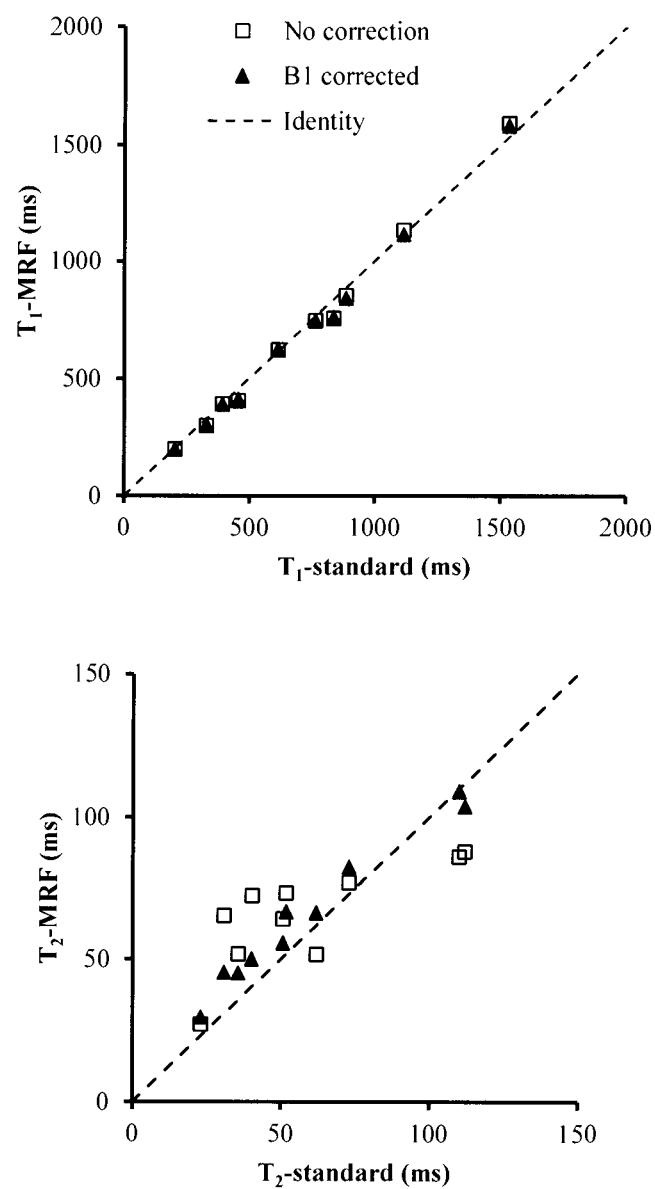
FIG. 2 illustrates T1 and T2 values produced using an example FISP-MRF approach before and after B1 correction.

FIG. 2 illustrates T1 and T2 values produced using FISP-MRF before and after B1 correction. A maximum 50% change in B1 magnitude was observed, which caused substantial changes in the parameters. Unlike conventional methods that typically show a dependence of T1 on B1, example FISP-MRF shows a dependence of T2 on B1. After the B1 correction, both T1 and T2 values produced by example FISP-MRF apparatus and methods agree with values acquired using standard methods.

Figure 3:
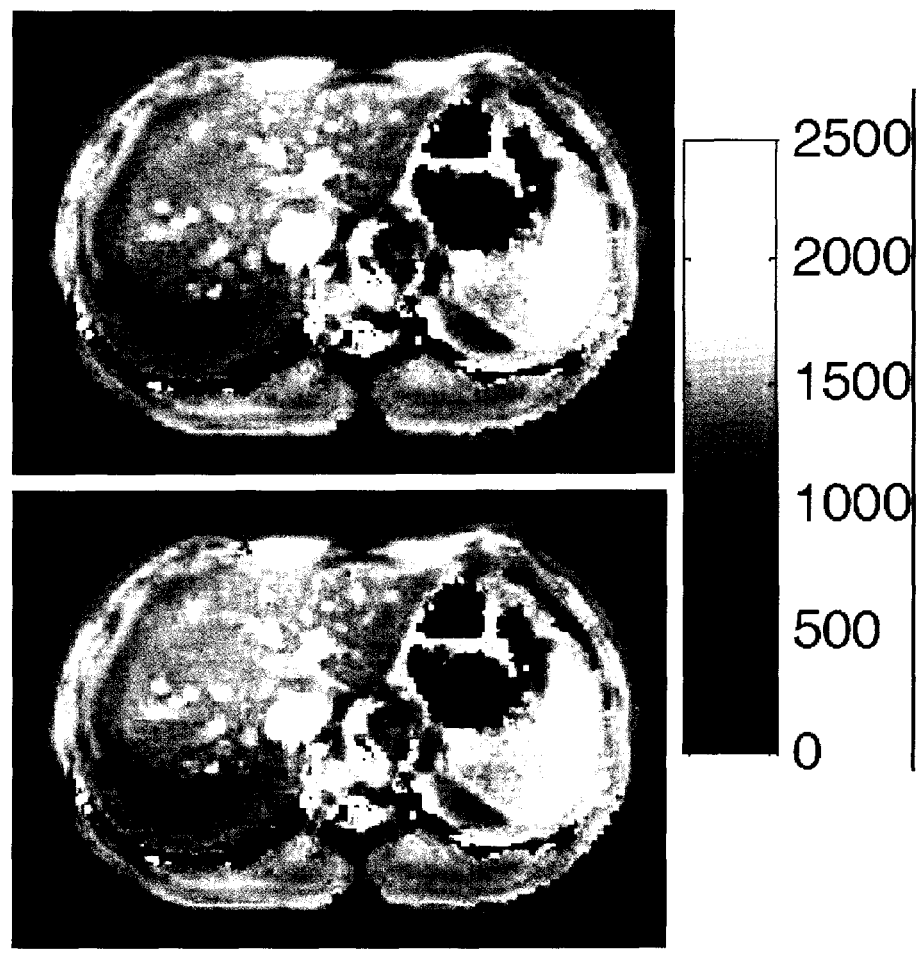
FIG. 3 illustrates parameter maps acquired with FISP-MRF before B1 corrections.
Figure 4:
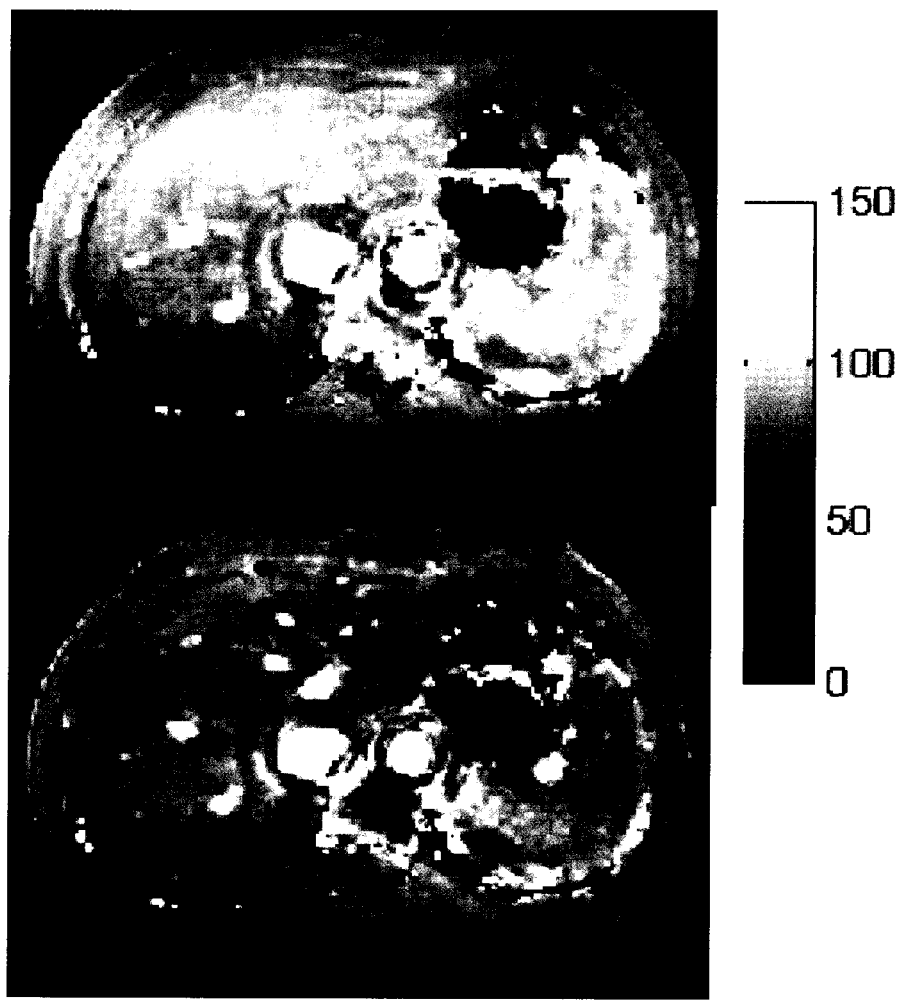
FIG. 4 illustrates parameter maps acquired with FISP-MRF after B1 correction.
Figure 5:
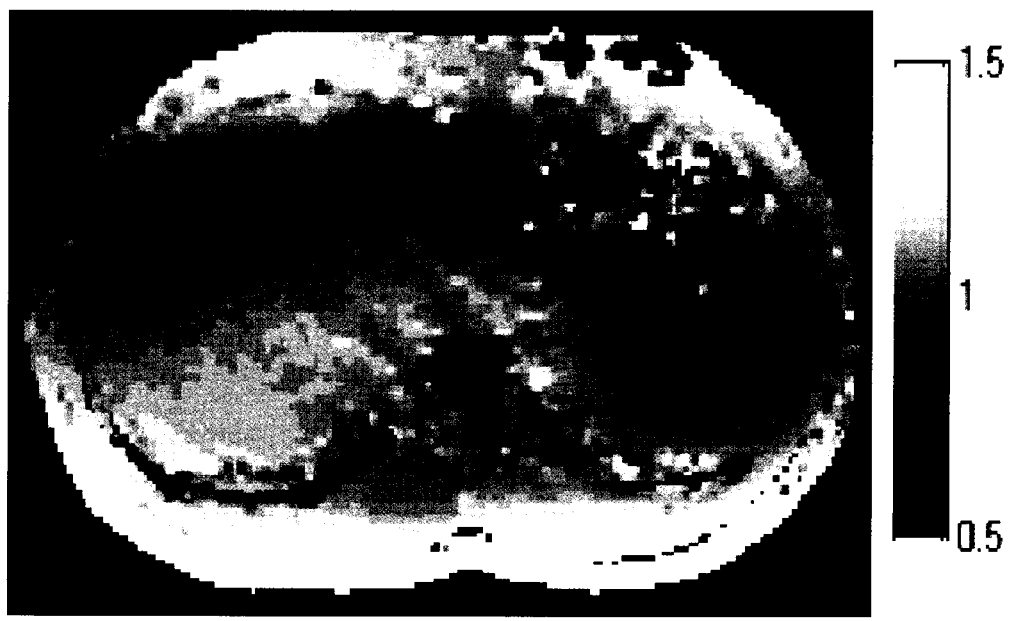
FIG. 5 illustrates the B1 map associated with FIGS. 3 and 4.

FIG. 3 illustrates T1 maps obtained from an asymptomatic volunteer. FIG. 4 illustrates T2 maps obtained from an asymptomatic volunteer. A significant difference in T2 (e.g., from 70 ms to 35 msec) is observed in the liver both with and without correction. The 35 msec is in better agreement with standard values. (See, e.g., De Bazelaire C M J, et al., Radiol, 2004). Example FISP-MRF provided superior performance over conventional bSSFP-MRF approaches. For example, banding artifacts seen in maps produced using a bSSFP-MRF approach were minimized or even eliminated in the FISP-MRF approach. FIG. 5 illustrates the B1 map associated with the T1 and T2 maps in FIGS. 3 and 4.

In conventional MR imaging, pathological changes often alter one or more tissue properties (e.g. T1, T2, proton density) simultaneously. Accurate and reliable diagnostics thus rely on comparing images with different weightings. An ideal clinical MRI exam would include simultaneous quantitative measurement of multiple tissue properties. Conventionally, quantitative analysis of MR relaxation parameters can be extremely challenging in moving regions like the abdomen. Using conventional approaches, several images must be acquired at different time points along an exponential signal decay or recovery curve to calculate the relevant relaxation parameter at each pixel. Thus, several full images are required to map a single parameter. This is an inherently inefficient process, which causes current clinical standard practices to eschew parameter mapping. Instead, current practices include examining a single image weighted by a parameter.

In one embodiment, to accelerate data sampling, highly under-sampled images were acquired with a uniform density spiral readout. Acceleration factors of 12, 24, and 48 were investigated. In one embodiment, 48 spiral interleaves with zero moment gradient compensation were designed for a 2D image to meet the Nyquist criteria using the minimum-time gradient design. In this embodiment, the maximum gradient amplitude and slew rate were 21 mT/m and 162 mT/m/ms, respectively. Other gradient amplitudes and slew rates may be employed in other embodiments. The readout time per spiral interleaf was 2.9 ms. In one verification of this embodiment, a total of 2500 under-sampled images were acquired in 17 s and the spiral interleafs in the images were rotated 7.5° to provide different spatial encoding. Other imaging parameters in this study were: FOV=44×44 cm; matrix size 224×224 for an effective in-plane resolution of 1.9 mm; TE, 1.3 ms; slice thickness 5 mm; RF pulse: 1-ms sinc pulse (time-bandwidth product: 4). Other imaging parameters may be employed in other embodiments.

Applying FISP-MRF for high-field abdominal imaging includes accounting for transmit field (B1) inhomogeneities encountered over a large FOV like that associated with the abdomen. Thus, a B1 field map may be acquired in a separate scan using the Bloch-Siegert technique. There are a wide variety of B1 mapping techniques available. Unlike conventional double-echo methods that use signal magnitude changes for B1 quantification, the Bloch-Siegert technique uses an off-resonance RF pulse to generate phase differences for B1 encoding. This technique provides an accurate and efficient B1 mapping that is insensitive to either T1 or B0 field inhomogeneity. One limitation of the Bloch-Siegert method is the potential high specific absorption rate (SAR) associated with the long (e.g., 8 ms) off-resonance RF pulses. Therefore, some Bloch-Siegert methods may use long repetition times (TRs), which results in an acquisition time of approximately 25 s per slice with Cartesian encoding. Example apparatus and methods may improve the efficiency of a Bloch-Siegert technique by combining it with a spiral readout. The improved method provides a 12-fold acceleration in scan time while preserving spatial resolution. An example central-out spiral trajectory improves the signal to noise ratio (SNR) of the images upon which phase measurement depends. While the Bloch-Siegert technique is described, different embodiments may acquire B1 field maps in different ways. In one embodiment that reduces the SAR, a gradient-echo based Bloch-Siegert sequence may be implemented with a multi-shot spiral acquisition. One example multi-shot acquisition may include 24 spiral interleaves per image with a readout duration per spiral interleaf of 3.0 ms. An off-resonance 8-ms Fermi pulse may be applied between the excitation pulse and spiral readout to induce a B1-dependent phase shift. In this embodiment, other imaging parameters included: FOV=44×44 cm; matrix size 128×128; slice thickness 5 mm; TR, 30 ms; TE, 1.3 ms. Other imaging parameters may be employed in other embodiments. In one study of this embodiment, two images were acquired with ±4 KHz frequency off-resonance in an interleaved manner and the total acquisition time for a B1 map was 1.8 s.

The spiral data for FISP-MRF and B1 measurements may be reconstructed using a non-uniform Fast Fourier Transform. For both the FISP-MRF and B1 measurements, an adaptive combination method may be used to estimate the coil sensitivity maps to combine images from individual coils. In one embodiment, for B1 quantification, a low-resolution B1 map with a matrix size of 128×128 may first be obtained from the phase difference of the two images acquired with different off-resonances. A median 4×4 filter may then be applied and the de-noised B1 map may then be interpolated to the matrix size 224×224 to match the size of the FISP-MRF measurement for MRF parameter mapping. Different matrix sizes and filter sizes may be employed in different embodiments.

To retrieve tissue properties including, for example, T1, T2 and M0 from the FISP-MRF data, a dictionary including the signal evolutions from possible combinations of parameters for a T1 range of 100 to 3000 ms, T2 range of 5 to 500 ms, and B1 range of 10% to 200% may be calculated using Bloch simulations. Detailed ranges and step sizes used for T1, T2 and B1 in one embodiment that included a total of 82,914 entries are presented in Table 1.

TABLE 1

|  | Range | Step size |
|---|---|---|
| $T_1$ | 100~600 | 100 |
|  | 600~1600 | 20 |
|  | 1700~2200 | 100 |
|  | 2300~3000 | 300 |

TABLE 1-continued

|  | Range | Step size |
|---|---|---|
| $T_2$ | 5~100 | 5 |
|  | 110~200 | 10 |
|  | 300~500 | 100 |
| B1 | 0.1~2 | 0.05 |

Example apparatus and methods were verified using both phantom studies and in vivo studies. In one phantom study, accuracy was validated using an agarose gel phantom that contained ten vials with different concentrations of gadolinium. A passively coupled transmit surface coil was used to generate a highly non-uniform B1 field. T1 and T2 relaxations times obtained from the FISP-MRF measurements with or without the consideration of the induced B1 field were then compared to values obtained using conventional methods. In one validation, reference T1 values were established using an inversion-recovery single-echo spin-echo sequence with a TR of 6 s and seven inversion times from 50 ms to 3800 ms, and reference T2 values were measured using a single-echo spin-echo sequence with a TR of 6 s and eight different echo times from 20 ms to 800 ms.

In one in vivo validation, quantitative measurements using FISP-MRF were performed on six asymptomatic subjects (M:F, 2:4; mean age, 26.8 years) and two patients (males, mean age, 56.5 years), one with metastatic lung adenocarcinoma and the other with hepatocellular carcinoma (HCC) recurrence after radiation therapy. The FISP-MRF and B1 measurements were performed at one to three different slice locations in the axial orientation. For the different slices, a FISP-MRF scan and a B1 scan were acquired consecutively in a single breath-hold of approximately 19 s to ensure the same slice coverage. For the patient scans, the slices were prescribed at the location of liver lesions based on coronal T2-weighted images or patients' previous MR exams. Four quantitative maps, including T1, T2, M0 and B1, were obtained for slices after the image reconstruction and post-processing.

MRF reconstruction was performed on the same in-vivo measurement using subsets of FISP-MRF data from the first 500 images up to 2000 images. Quantitative maps reconstructed from the 2500 images were used as a reference. The results obtained from the subsets were compared to this reference and normalized Root Mean Square Error (NRMSE) was calculated for T1, T2 and M0.

Figure 19:
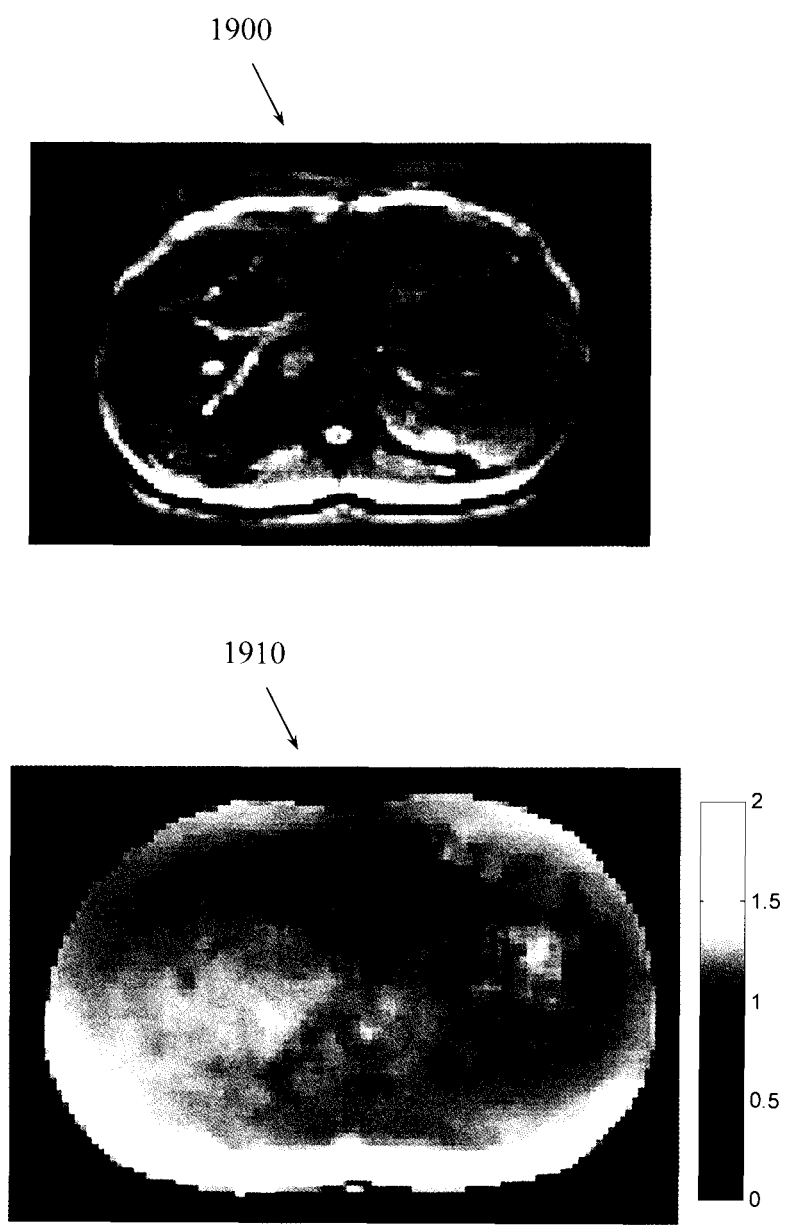
FIG. 19 illustrates an example abdominal image.

FIG. 19 shows one example abdominal image 1900 acquired using the Bloch-Siegert method and its corresponding B1 map 1910. A non-uniform B1 field was observed, particularly in the anterior and posterior areas of the abdomen. The average B1 value was 92.3% across the abdomen, with a minimum B1 of approximately 46.8% encountered at the stomach and a maximum B1 of 140.7% at the posterior. These values represent the percentage of the B1 field anticipated to be created by the MR apparatus.

Figure 20:
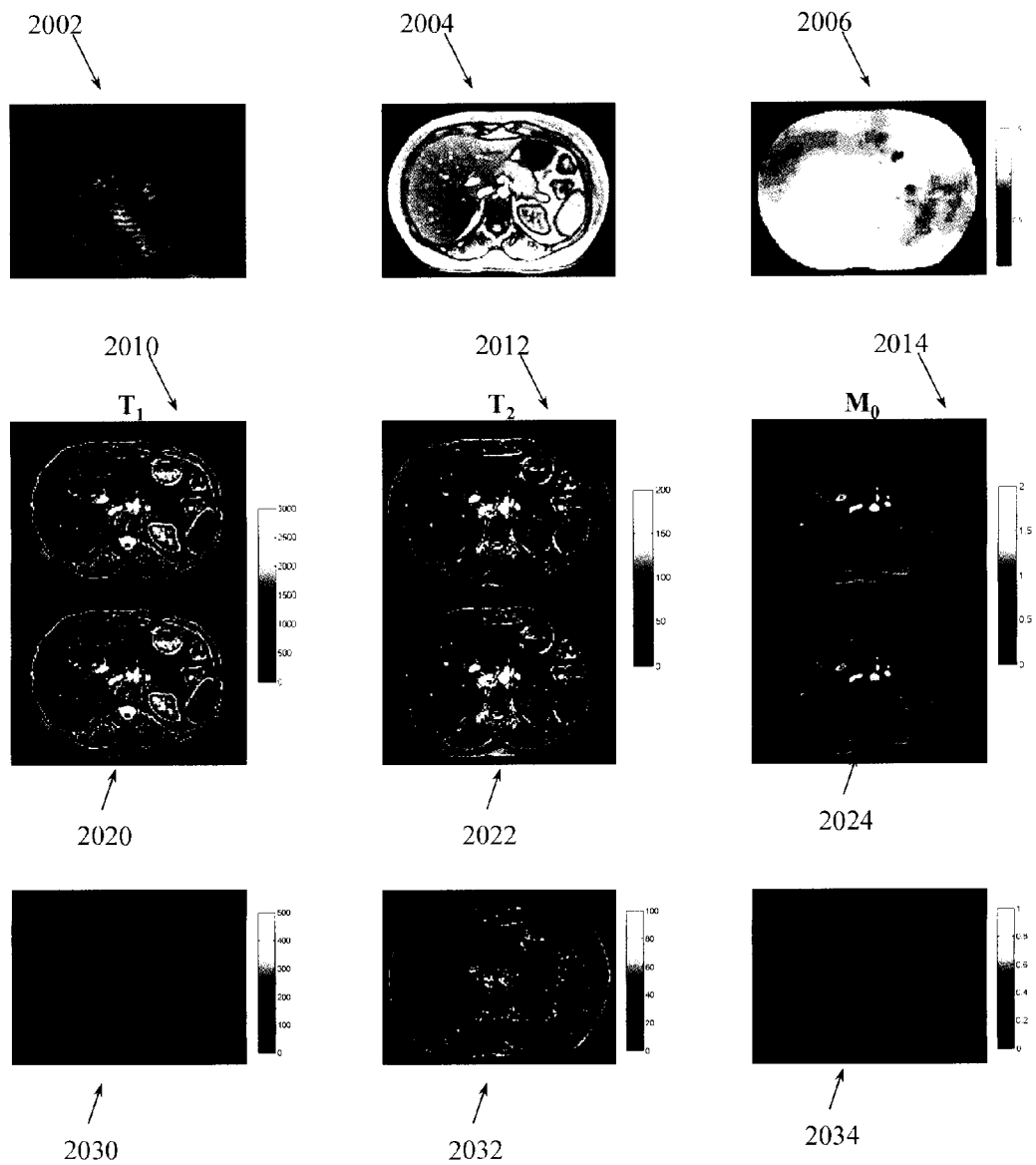
FIG. 20 illustrates quantitative maps obtained from a normal volunteer.

FIG. 20 presents the quantitative maps obtained from a normal volunteer. Image 2002 shows one representative image out of 2500 images. Significant aliasing artifacts were observed due to the high acceleration factor. The anatomy of the acquired slice can be observed from the image summed up from the 2500 aliased images as illustrated in image 2004. The corresponding B1 map for this slice is shown in image 2006. The three quantitative maps (T1, T2 and M0) before and after B1 correction are shown in images 2010-2014 and 2020-2024, respectively. The difference maps between the before and after are shown in images 2030-

2034. Similar to the validation performed using the phantom, a clear difference in the T2 map rather than T1 was observed after the B1 correction and the pattern of T2 difference matches well with that of B1 map 2006 and 2032. For example, towards to the edge of the liver where B1 was 78.4%, a difference of 46.9% in T2 relaxation time was observed. However, the difference for T2 was only 2.2%. Compared to the T2 map without B1 correction 2012, a visually smoother T2 map was observed in the entire liver after the B1 correction 2022. In addition, no banding artifacts were observed in the maps.

Figure 21:
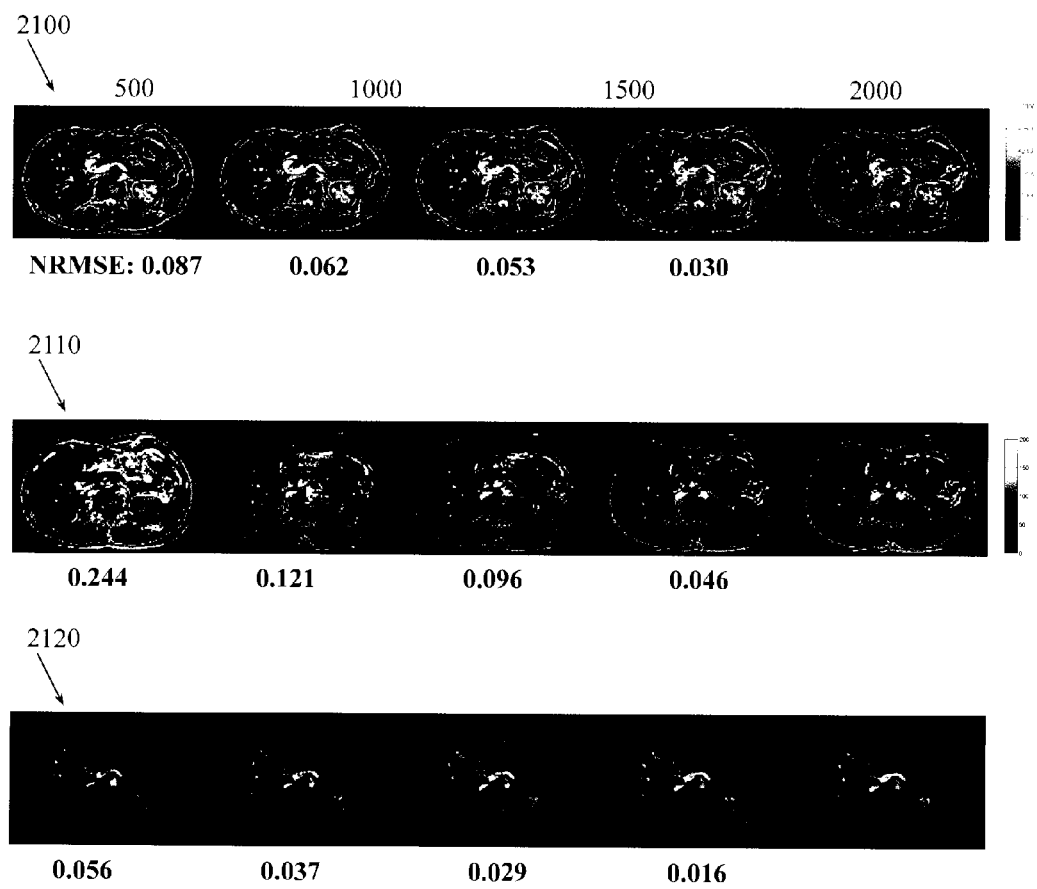
FIG. 21 illustrates T1, T2, and M0 maps associated with the patient of FIG. 20.

The effect of the number of images on the accuracy of mufti-parametric quantification was evaluated using an in-vivo dataset acquired from a normal subject. FIG. 21 shows the T1, T2 and M0 maps obtained from the same subject reconstructed using the first 500, 1000, 1500 and 2000 images. The maps obtained using all 2500 images are shown on the right columns of 2100, 2110, and 2120 as a reference. A monotonic decrease in NRMSE was observed in all three quantitative maps with an increasing number of images. For both T1 and M0, MRF quantification using the first 500 images already presents visually smooth maps that are similar to the reference maps (NRMSE=0.087 for T1 and 0.056 for M0). However, for T2 quantification, substantial differences from reference images or values were observed in the maps 2110 computed with 1500 images or less. When 2000 images were employed, a close match with little artifact errors was achieved, which yields a NRMSE of 0.046.

Figure 22:
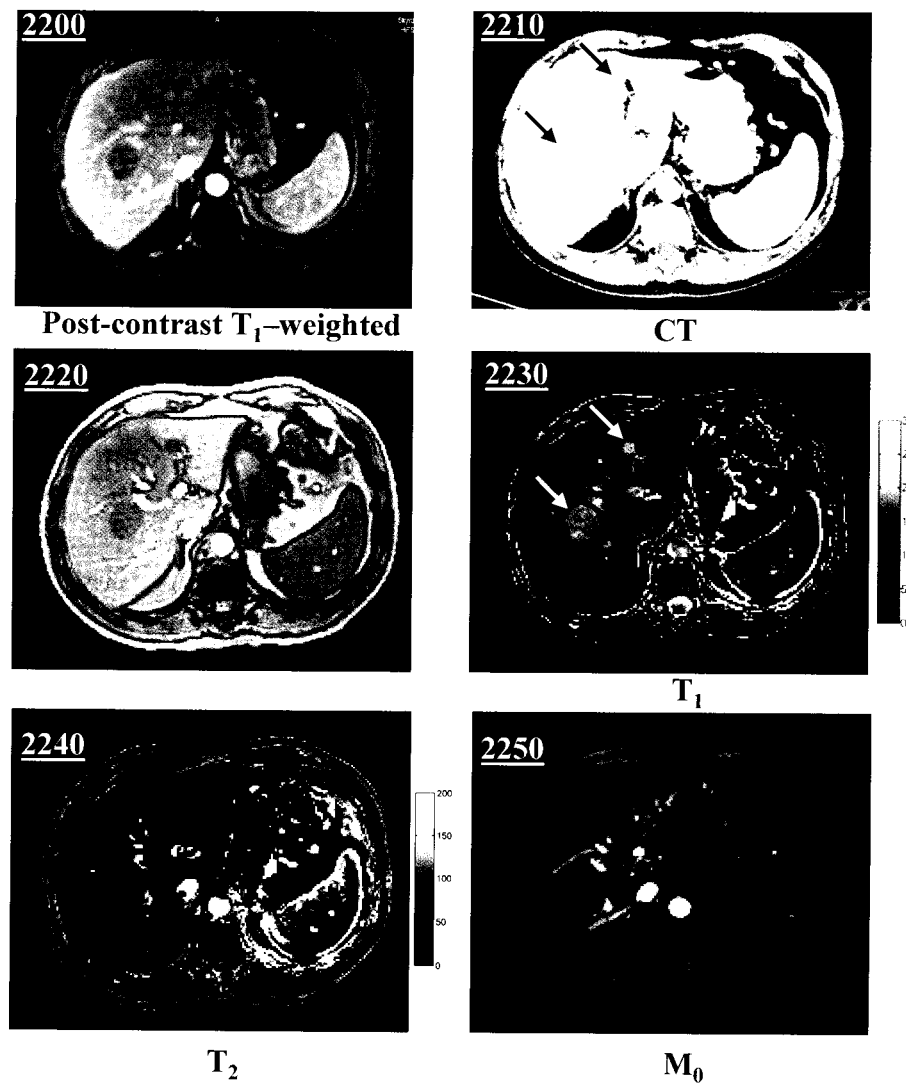
FIG. 22 illustrates results obtained from a patient with metastatic lung adenocarcinoma.

For further validation, two patients with different types of liver lesions were scanned with example FISP-MRF methods and apparatus. FIG. 22 shows the quantitative MRF maps and conventional images acquired from a patient with metastatic lung adenocarcinoma. Excellent image quality and visualization of abnormal tissues were achieved in the quantitative maps obtained using the example FISP-MRF apparatus and methods. Two metastatic lesions (lesion 1, 32.9 mm; lesion 2, 9.8 mm) were observed in the liver from the quantitative MRF results in images 2230 and 2240, which agrees well with the clinical CT and MRI findings illustrated in 2200 and 2210. Compared to the normal surrounding tissue, similar increases in T1 relaxation times were observed for both metastatic lesions (lesion 1, 1462 ms; lesion 2, 1582 ms; surrounding tissue, 686 ms). Apparent T2 increase was only observed in lesion 1 as compared to the surrounding tissue (lesion 1, 57 ms; lesion 2, 19 ms; surrounding tissue, 26 ms), which indicates the heterogeneity between the two lesions.

Figure 23:
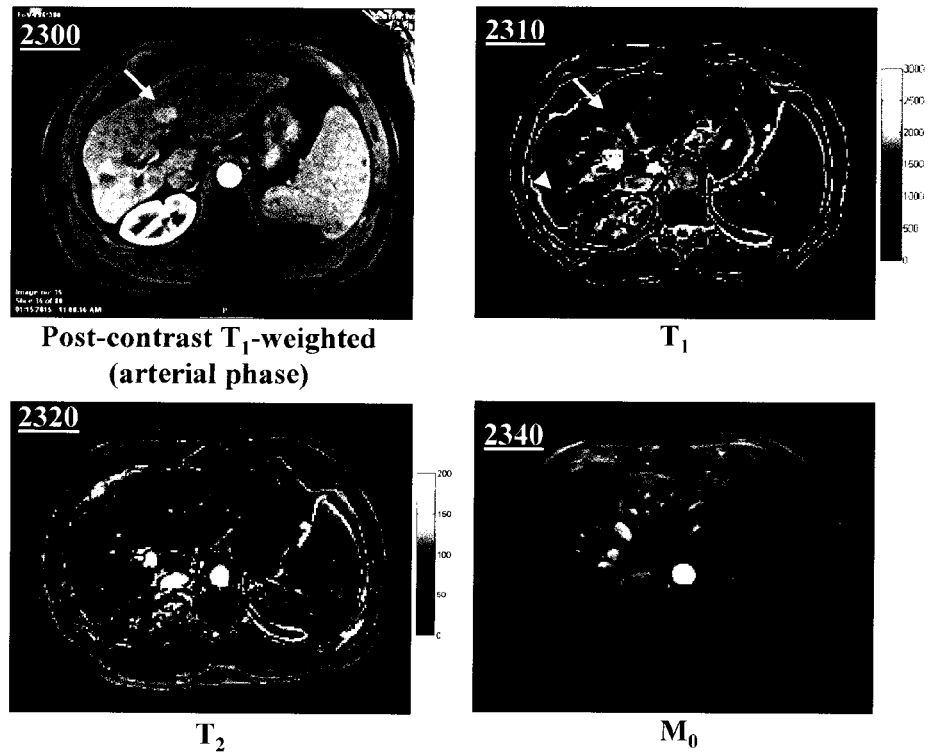
FIG. 23 illustrates results obtained from a patient with hepatocellular carcinoma (HCC).

FIG. 23 shows the results obtained from a patient with HCC. The patient has a new HCC lesion after treatment, which is visible in the post-contrast image 2300 acquired at the arterial phase 20 s after contrast injection. Some heterogeneous tissues in the right hepatic lobe, possibly related to prior radiation therapy, are also visible in image 2300. Compared to the surrounding tissue, this new HCC lesion had a slightly lower T1 value of 789 ms versus 871 ms as illustrated in image 2310. T1 for the post-treatment area was substantially increased to 1038 ms. The T2 value for this post-treatment area also increased slightly from 40 ms to 26 ms as shown in image 2320. No apparent difference was observed in the M0 map for the lesions as illustrated in image 2330.

Example apparatus and methods use MRF to cause resonant species (e.g., resonant tissues) in an object to produce pseudorandom MR signal evolutions. The pseudorandom signal evolutions may be compared to a dictionary of stored signal evolutions. The comparison may be performed using, for example, an orthogonal matching pursuit (OMP) technique. (See, e.g., Doneva M, et al. MRM, 2010) The stored signal evolutions may be from previous acquisitions or may even be from theoretical models. For example, the stored signal evolutions can be from a set described by:

$$SE = \sum_{i=1}^{N_S} \prod_{i=1}^{N_A} \sum_{j=1}^{N_{RF}} R_{i(\alpha)} R_{RF_{ij}(\alpha,\phi)} R(G) E_i(T1, T2, \ldots) DP dM_0 \quad [1]$$

or $$SE = \sum_{i=1}^{N_S} \prod_{i=1}^{N_A} \prod_{j=1}^{N_{RF}} R_{i(\alpha)} R_{RF_{ij}(\alpha,\phi)} R(G) E_i(T1, T2, \ldots) DP dM_0 \quad [2]$$

where:

SE is a signal evolution, $N_S$ is a number of spins, $N_A$ is a number of sequence blocks, $N_{RF}$ is a number of RF pulses in a sequence block, a is a flip angle, $\phi$ is a phase angle, Ri($\alpha$) is a rotation due to off resonance, $R_{RFij}(\alpha,\phi)$ is a rotation due to RF differences, R(G) is a rotation due to a gradient, T1 is spin-lattice relaxation, T2 is spin-spin relaxation, D is diffusion relaxation, Pd is proton density, $E_i$(T1, T2, ... ) is decay due to relaxation differences, and $M_0$ is the default or equilibrium magnetization.

Some MRF investigations may involve a sample for which there is a priori knowledge about the resonant species that are likely to be encountered. The a priori knowledge may even include information concerning possible or expected ratios of the amounts of the resonant species to be encountered in the sample or about the properties of the resonant species. When the sample has some properties (e.g., T1 relaxation time, T2 relaxation time) or combinations of properties that are likely to fall in a certain range, then it may be possible to simplify or even focus the pattern matching portion of MRF. Therefore, example apparatus and methods may use a dictionary having signal evolutions that cover combinations of T1 values in a range of 10-3000 ms and T2 values in the range of 5-500 ms. The signal evolutions may be modified to account for B1 variations from 10% to 200% of an intended B1 field.

MRF involves measuring pseudorandom MR signal evolutions produced in response to MRF pulse sequences. MRF also includes generating modeled signal evolutions that may be stored in a dictionary. The dictionary entries may be a function of several parameters. If the composition of the sample to be interrogated is known ahead of time, then a mathematical operation (e.g., weighted sum) of dictionary entries corresponding to the known components may be used to model signal evolutions and an inverse mathematical operation (e.g., matrix pseudo-inverse) may be used to compute the relative fraction of components assumed to be present based on a received signal evolution.

Figure 18:
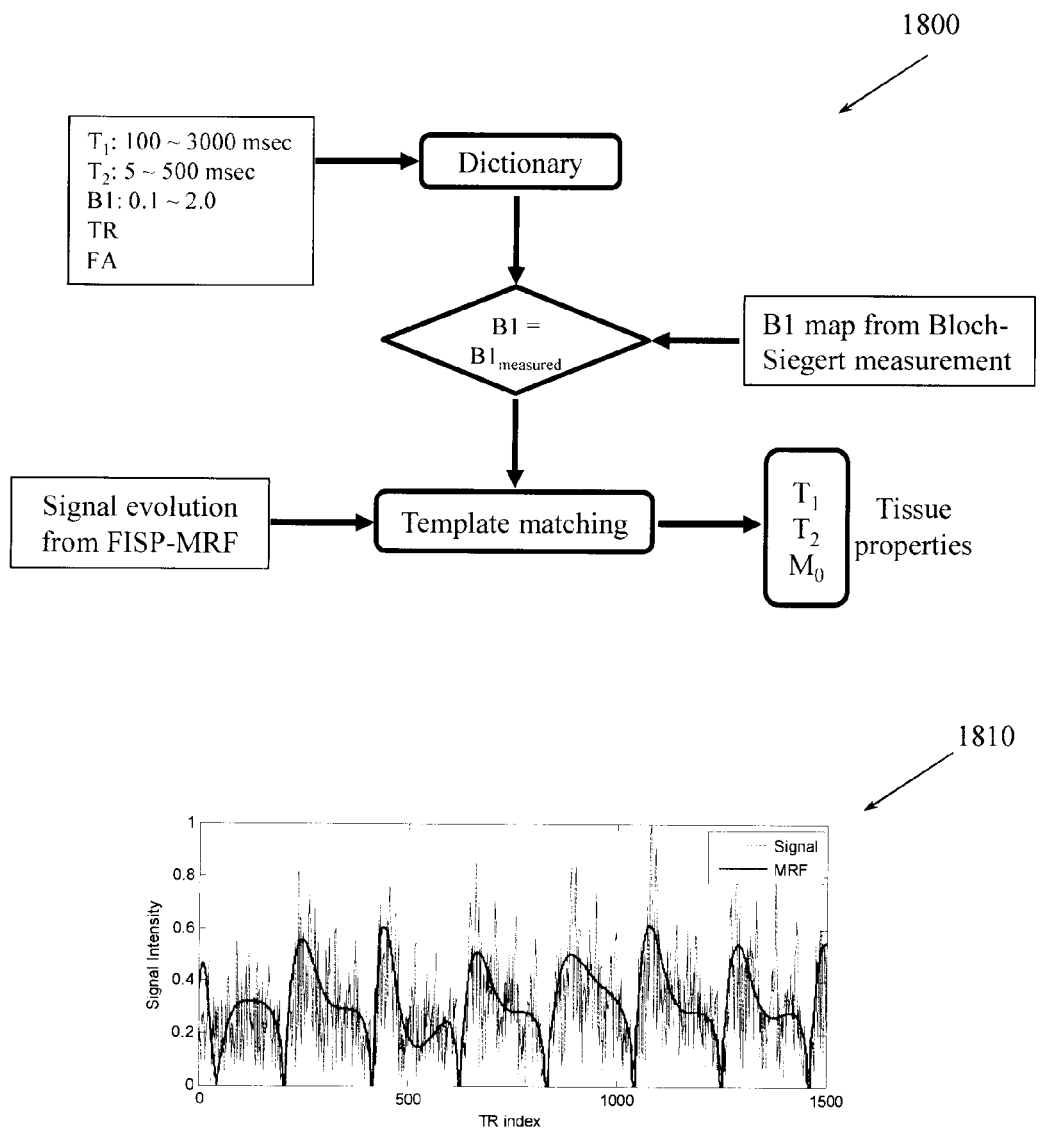
FIG. 18 illustrates an example FISP-MRF process that includes B1 correction, a representative signal evolution curve, and a matching dictionary entry.

The acquired signals in the pixels of the highly accelerated images may then be matched to entries in the dictionary that have the same B1 values as measured. A "best" or "matching" entry may be identified using MRF. The best or matching entry yields the underlying parameters that were used to form the dictionary entry. FIG. 18 illustrates an example FISP-MRF process 1800 that includes B1 correction. FIG. 18 also illustrates an example representative signal evolution curve and a matched dictionary entry 1810.

MRF simultaneously provides quantitative data concerning multiple MR parameters. Observed signal evolutions are matched to dictionary entries using, for example, template matching or other matching or comparing processes. In one example matching process, the inner product is computed between a noisy acquired signal and entries in a dictionary to find the stored signal evolution to which an acquired signal evolution most closely matches. In other examples, other pattern matching or similarity finding approaches are performed. Values related to the dictionary entry that matched the acquired noisy signal may then be retrieved. In one example, the values may be stored in the dictionary, while in another example MR parameters may be stored in a data store separate from the dictionary. In one embodiment, the values may be retrieved by performing a mathematical operation on a signal evolution.

Figure 6:
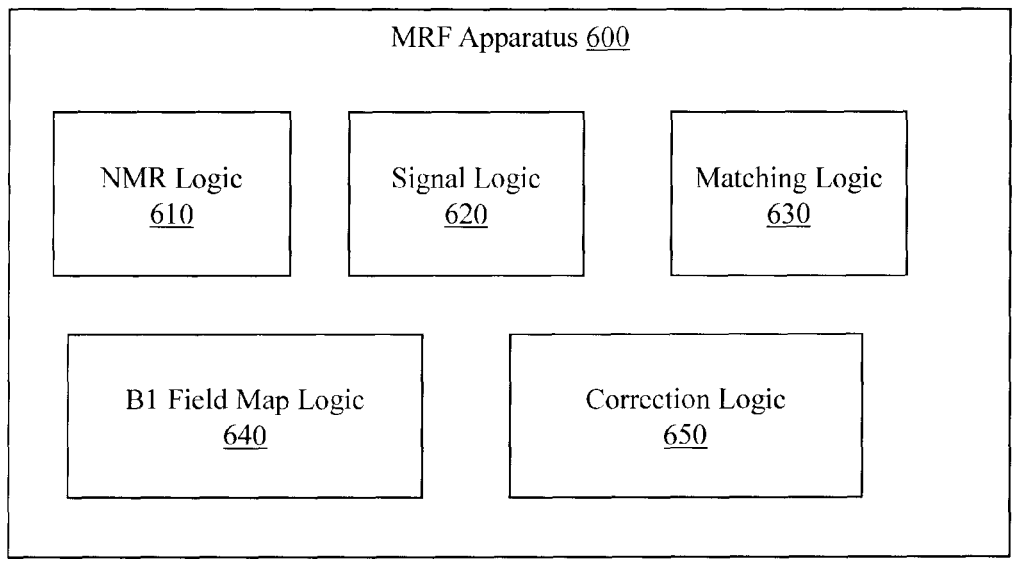
FIG. 6 illustrates an example MR apparatus associated with rapid quantitative abdominal imaging using FISP-MRF.

FIG. 6 illustrates an MRF apparatus 600. MRF apparatus 600 may, for example, be part of a Siemens 3T Skyra scanner having 32 receive channels. MRF apparatus 600 may simultaneously quantify MR parameters including T1, T2, M0, or proton density for an object to which a FISP-MRF pulse sequence is applied.

MRF apparatus 600 includes an NMR logic 610. In one embodiment, the NMR logic 610 applies RF energy to the object according to a FISP-MRF pulse sequence. Original MRF approaches for the brain may have employed an inversion-recovery balanced steady state fee-precession (IR-bSSFP). However, the IR-bSSFP may be sensitive to magnetic field inhomogeneities which may in turn make it poorly suited for high-field abdominal imaging. Thus, example apparatus and methods may employ a FISP-MRF technique.

NMR logic 610 repetitively and variably samples an object in a (k, t, E) space to acquire a first set of data. The first set of data may be a set of NMR signals that may have non-constant amplitude and/or phase. Members of the set of NMR signals are associated with different points in the (k, t, E) space. In different embodiments the different points are sampled according to a plan where t and/or E varies non-linearly and/or in a non-constant manner. The first set of data may have contributions of NMR signals from different resonant species (e.g., resonant tissues) in the sample that produced the first set of data. Apparatus 600 facilitates producing quantitative data concerning the different resonant species (e.g., normal liver, cancerous lesion) in the sample.

MRF apparatus 600 also includes a signal logic 620. Signal logic 620 produces an NMR signal evolution from the acquired NMR signals or the corrected NMR signals. The signal evolution may include a number of NMR signals acquired over a period of time. The signal evolution may have contributions from the different resonant species. Different amounts of resonant species in a sample may cause different signal evolutions to be produced. For example, a portion of a liver that is 100% normal liver tissue may produce a different signal than a portion of a liver that is 100% cancerous lesion.

MRF apparatus 600 also includes a B1 field map logic 640 that stores data associated with a B1 field map associated with a B1 field produced by the NMR apparatus and present in the volume while the first set of data is received.

MRF apparatus 600 also includes a correction logic 650 that produces a first set of corrected data from the first set of data based, at least in part, on the B1 field map. Elements of the first set of data may be adjusted up or down based on the B1 field map. For example, when the B1 field map indicates that an inhomogeneity in the B1 field may have caused a received value to be too high, then the value may be reduced. Additionally, when the B1 field map indicates that an inhomogeneity in the B1 field may have caused a received value to be too low, then the value may be increased.

MRF apparatus 600 also includes a matching logic 630. Matching logic 630 compares the NMR signal evolution or information associated with the NMR signal evolution to a collection (e.g., dictionary, database) of stored signal evolutions to find a match for the acquired NMR signal evolution. In one embodiment, information concerning relative proportions of resonant species that contributed to the selected stored signal evolution is retrievable using the match. The matching logic 630 may perform a match for a signal evolution associated with each pixel or voxel examined.

"Match" as used herein refers to the result of comparing signals. "Match" does not refer to an exact match, which may or may not be found. A match may be the signal that most closely resembles another signal. A match may be the first signal that matches another signal to within a threshold. A match may be found by template matching, pattern matching, or other comparison approaches. The reference information may be, for example, a previously acquired signal evolution, a simulated signal evolution, an item derived from a signal evolution other than the produced NMR signal evolution, and other information. The reference information may include signal evolutions from different tissue types (e.g., healthy, diseased, advanced disease, normal, abnormal). The reference information may include signal evolutions that are formed from combinations of resonant species with combinations of MR parameters.

In one embodiment, the collection of stored signal evolutions includes a signal evolution having information associated with a first resonant species and a second resonant species. The information associated with the first resonant species may be produced by controlling an MR property or properties associated with the first resonant species to be constant or to be within a first known range or ranges. Information associated with the second resonant species may also be produced by controlling an MR property or properties associated with the second resonant species to be constant or to be within a second known range or ranges. When the collection of stored signal evolutions includes signal evolutions associated with a finite, small (e.g., 2, 3) number of resonant species, and when the signals used to produce the signal evolutions are constrained within well-defined ranges, then relative fractions of the resonant species that contributed to the acquired NMR signal evolution may be determined from the matched signal evolution. The relative fractions may be determined in different ways. In one example, the relative fractions may be decoded from the matched signal evolution.

The collection of stored signal evolutions include a signal selected from equations 1 or 2. In other embodiments, the collection of stored signal evolutions include a signal selected from:

$$S_i = R_i E_i (S_{i-1}) \qquad [3]$$

or $$S_i = R_i E_i \sum_{x=1}^{i-1} R_x E_x (S_x) \qquad [4]$$

or $$S_i = R_i E_i \prod_{x=1}^{i-1} R_x E_x (S_x) \qquad [5]$$

or $$S_i = \sum_{s=1}^{N_s} R_{s,i} E_{s,i}(S_{s,i-1}) \quad [6]$$

or $$S_i = \sum_{s=1}^{N_s} R_{s,i} E_{s,i} \sum_{x=1}^{i-1} R_{s,x} E_{s,x}(S_{s,x}) \quad [7]$$

or $$S_i = \sum_{s=1}^{N_s} R_{s,i} E_{s,i} \prod_{x=1}^{i-1} R_{s,x} E_{s,x}(S_{s,x}) \quad [8]$$

where:

$S_0$ is the default or equilibrium magnetization, $S_i$ is a vector that represents the different components of the magnetization Mx, My, Mz during acquisition block i, $R_i$ is the combination of rotational effects that occur during acquisition block i, and $E_i$ is the combination of effects that alter the amount of magnetization in the different states for acquisition block i. Equations [1] through [8] may be referred to collectively as the "MRF signal evolution equations".

Figure 7:
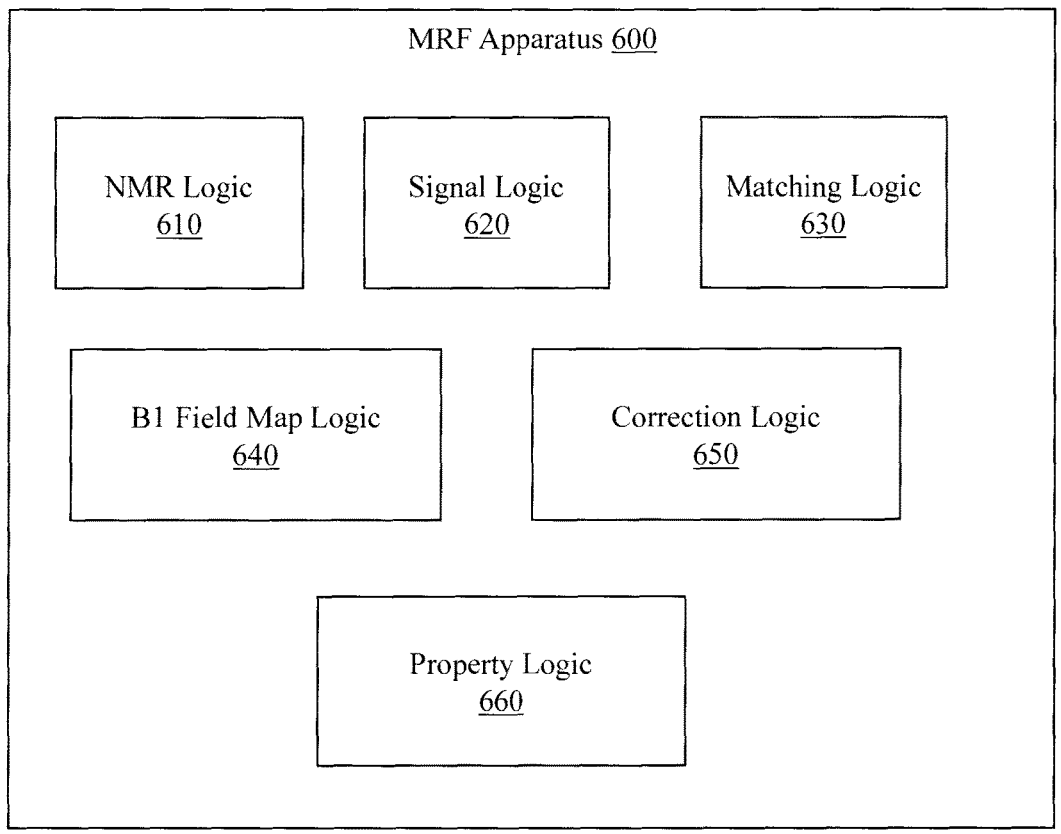
FIG. 7 illustrates an example MR apparatus associated with rapid quantitative abdominal imaging using FISP-MRF.

FIG. 7 illustrates another embodiment of apparatus 600. This embodiment also includes a property logic 660. Property logic 660 identifies the object as having a property based, at least in part, on the relative proportions. The property may describe, for example, whether the object is diseased or healthy, whether the object has T1, T2, or other parameters that fall within a normal range or that fall outside a normal range, or other properties.

While property logic 660 is illustrated as being part of MRF apparatus 600, in one embodiment, the property logic 660 may reside in an apparatus separate from the MRF apparatus 600. In this embodiment, MRF apparatus 600 may provide fraction data to the separate apparatus housing property logic 660.

Figure 8:
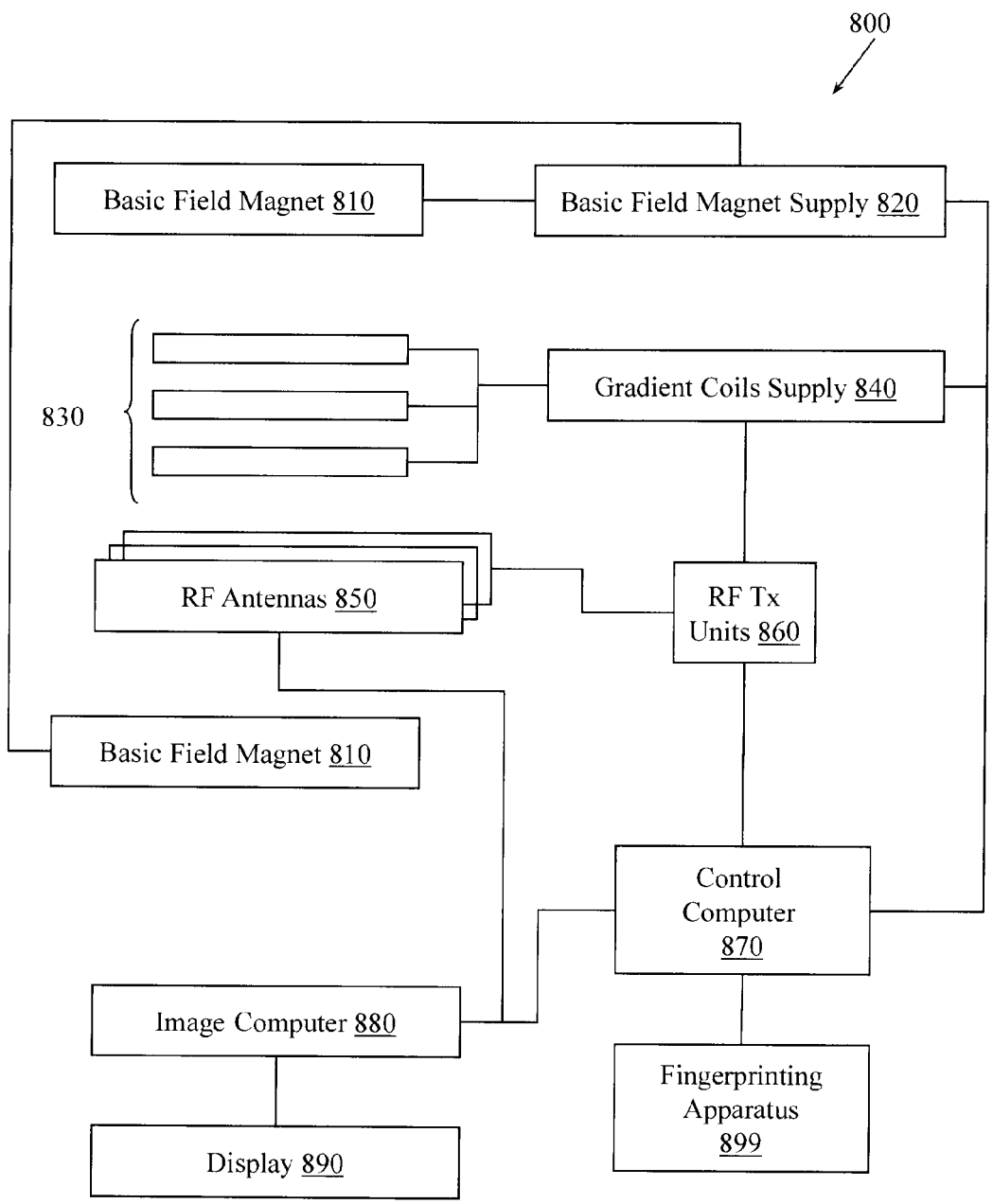
FIG. 8 illustrates an example MR apparatus associated with rapid quantitative abdominal imaging using FISP-MRF.

FIG. 8 illustrates an example MR apparatus 800 having a fingerprinting apparatus 899 that facilitates rapid quantitative abdominal imaging with FISP-MRF. The fingerprinting apparatus 899 may be configured with elements of example apparatus described herein or may perform example methods described herein. While fingerprinting apparatus 899 is illustrated as part of MR apparatus 800, in one example, fingerprinting apparatus 899 may be a separate apparatus or apparatuses.

In one embodiment, fingerprinting apparatus 899 may include a collection logic that collects a received signal evolution from a tissue experiencing NMR in response to an MRF excitation applied to the tissue by the MRI apparatus 800. Fingerprinting apparatus 899 may also include a data store that stores a dictionary of MRF signal evolutions. Unlike conventional systems, members of the dictionary may be specially crafted combinations of constrained information associated with two or more resonant species. Information concerning the composition of the tissue with respect to the two or more resonant species is retrievable using a matched signal evolution.

Fingerprinting apparatus 899 may also include a B1 field map logic that acquires and stores data associated with a B1 field map associated with a B1 field map that is produced by the MRI apparatus 800 and experienced by the sample. The B1 field map may then be used to correct data used to produce the signal evolution.

Fingerprinting apparatus 899 may also include a correction logic that corrects the received signal evolution to account for an inhomogeneous B1 field. The correction logic may correct the data using the B1 field data. The B1 field data may indicate that the received signal evolution needs to be adjusted up or down to account for the inhomogeneous B1 field.

The fingerprinting apparatus 899 may also include a selection logic that selects a matching member of the dictionary that is most closely related to the signal evolution and establishes the matching member as the matched signal evolution. Fingerprinting apparatus 899 may also include a characterization logic that identifies a category for the tissue based, at least in part, on the composition of the tissue as identified using the matched signal evolution. The characterization logic may identify the category for the tissue using a quantitative magnetic resonance based approach. The category for the tissue may distinguish healthy tissue from diseased tissue or may distinguish tissue exhibiting T1 and T2 parameters that are within an expected range from tissue exhibiting T1 and T2 parameters that are outside an expected range.

The apparatus 800 includes a basic field magnet(s) 810 and a basic field magnet supply 820. Ideally, the basic field magnets 810 would produce a uniform B0 field. However, in practice, the B0 field may not be uniform, and may vary over an object being analyzed by the MR apparatus 800. MR apparatus 800 may include gradient coils 830 that emit gradient magnetic fields like $G_S$, $G_P$ and $G_R$. The gradient coils 830 may be controlled, at least in part, by a gradient coils supply 840. In some examples, the timing, strength, and orientation of the gradient magnetic fields may be controlled, and thus selectively adapted, during an MR procedure.

MR apparatus 800 may include a set of RF antennas 850 that generate RF pulses and receive resulting NMR signals from an object to which the RF pulses are directed. In some examples, how the pulses are generated and how the resulting MR signals are received may be controlled and thus may be selectively adapted during an MR procedure. Separate RF transmission and reception coils can be employed. The RF antennas 850 may be controlled, at least in part, by a set of RF transmission units 860. An RF transmission unit 860 may provide a signal to an RF antenna 850.

The gradient coils supply 840 and the RF transmission units 860 may be controlled, at least in part, by a control computer 870. In one example, the control computer 870 may be programmed to control an NMR device as described herein. Conventionally, the MR signals received from the RF antennas 850 can be employed to generate an image and thus may be subject to a transformation process like a two dimensional FFT that generates pixilated image data. The transformation can be performed by an image computer 880 or other similar processing device. The image data may then be shown on a display 890.

While FIG. 8 illustrates an example MR apparatus 800 that includes various components connected in various ways, it is to be appreciated that other MR apparatus may include other components connected in other ways.

Some portions of the detailed descriptions that follow are presented in terms of algorithms and symbolic representations of operations on data bits within a memory. These algorithmic descriptions and representations are used by those skilled in the art to convey the substance of their work to others. An algorithm, here and generally, is conceived to be a sequence of operations that produce a result. The operations may include physical manipulations of physical quantities. Usually, though not necessarily, the physical quantities take the form of electrical or magnetic signals capable of being stored, transferred, combined, compared, and otherwise manipulated in a logic, and so on. The physical manipulations create a concrete, tangible, useful, real-world result.

It has proven convenient at times, principally for reasons of common usage, to refer to these signals as bits, values, elements, symbols, characters, terms, numbers, and so on. It should be borne in mind, however, that these and similar terms are to be associated with the appropriate physical quantities and are merely convenient labels applied to these quantities. Unless specifically stated otherwise, it is appreciated that throughout the description, terms including processing, computing, determining, and so on, refer to actions and processes of a computer system, logic, processor, or similar electronic device that manipulates and transforms data represented as physical (electronic) quantities.

Example methods may be better appreciated with reference to flow diagrams. While for purposes of simplicity of explanation, the illustrated methodologies are shown and described as a series of blocks, it is to be appreciated that the methodologies are not limited by the order of the blocks, as some blocks can occur in different orders and/or concurrently with other blocks from that shown and described. Moreover, less than all the illustrated blocks may be required to implement an example methodology. Blocks may be combined or separated into multiple components. Furthermore, additional and/or alternative methodologies can employ additional, not illustrated blocks.

Figure 9:
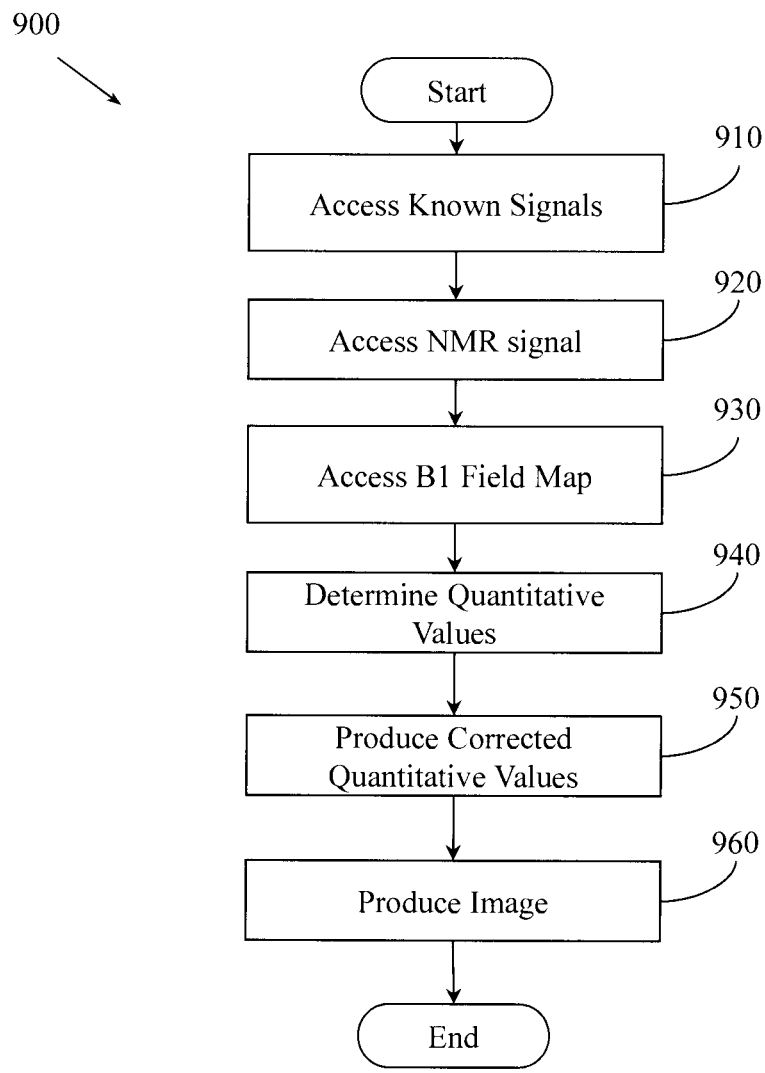
FIG. 9 illustrates an example method associated with rapid quantitative abdominal imaging using FISP-MRF.

FIG. 9 illustrates a method 900 associated with rapid quantitative abdominal imaging using FISP-MRF. Method 900 includes, at 910, accessing a set of known MRF signal evolutions. Unlike conventional systems, a member of the set of known MRF signal evolutions may have been produced by combining constrained data associated with NMR signals associated with a plurality of selected resonant species. In one embodiment, combining the data involves using a forward operation (e.g., weighted sum) for which an inverse operation (e.g., matrix pseudo-inverse) that identifies relative fractions of resonant species associated with the member is available.

Method 900 also includes, at 920, accessing an acquired NMR signal. The acquired NMR signal was produced by a volume that may contain different resonant species in different proportions. For example, the volume may be an abdomen and the resonant species may include fluid, cells, fat, and other resonant species found in the abdomen. The different resonant species simultaneously produce individual NMR signals in response to MRF excitation produced by a FISP-MRF pulse sequence. In one embodiment, the different resonant species may be, for example, normal tissue, differentiated tissue, lesion tissue, or other tissue types.

In one embodiment, the acquired NMR signal may be associated with one of at least one thousand under-sampled images acquired in less than twenty seconds at an under-sampling rate of at least 12. In another embodiment, the acquired NMR signal is associated with one of at least one thousand under-sampled images acquired in less than fifteen seconds at an under-sampling rate of at least 24. In another embodiment, the acquired NMR signal is associated with one of at least one thousand under-sampled images acquired in less than ten seconds at an under-sampling rate of at least 48.

Method 900 also includes, at 930, accessing a B1 field map that characterizes a B1 field produced by the NMR apparatus in the volume. Characterizing the B1 field may include identifying whether the B1 field would cause received signals to be artificially high or low.

Method 900 also includes, at 940, determining quantitative values for two or more parameters of a resonant species in a voxel in the volume based, at least in part, on matching the acquired NMR signal to the set of known MRF signal evolutions. The two or more parameters include T1, T2, and proton density, T1 being spin-lattice relaxation, T2 being spin-spin relaxation.

Method 900 also includes, at 950, producing corrected quantitative values based, at least in part, on the B1 field map. Producing a corrected quantitative value may include, for example, increasing or decreasing the value based on the strength of the B1 field at a location as reported in the B1 field map.

While determining quantitative values and producing corrected quantitative values using the B1 field map are described in that order, in one embodiment, the B1 field map may be used to correct the acquired NMR signal before pattern matching is performed.

Method 900 also includes, at 960, producing an image of at least a portion of the volume. The image may be a T1 weighted image, a T2 weighted image, a proton density image map or other image. The image may be based, at least in part, on quantitative values associated with the selected entry. In one embodiment, producing the image includes performing a reconstruction on the corrected quantitative values using a non-uniform fast Fourier transform (NUFFT). In one embodiment, the reconstruction may be performed using one spiral interleave.

The stored signals and information derived from reference signal evolutions may be associated with a potentially very large data space. The data space for signal evolutions can be partially described by the MRF signal evolution equations.

While FIG. 9 illustrates various actions occurring in serial, it is to be appreciated that various actions illustrated in FIG. 9 could occur substantially in parallel. By way of illustration, a first process could control accessing known signals, a second process could control acquiring NMR signals, a third process could access a B1 field map and correct the NMR signals and a fourth process could produce an image. While four processes are described, it is to be appreciated that a greater and/or lesser number of processes could be employed.

Figure 10:
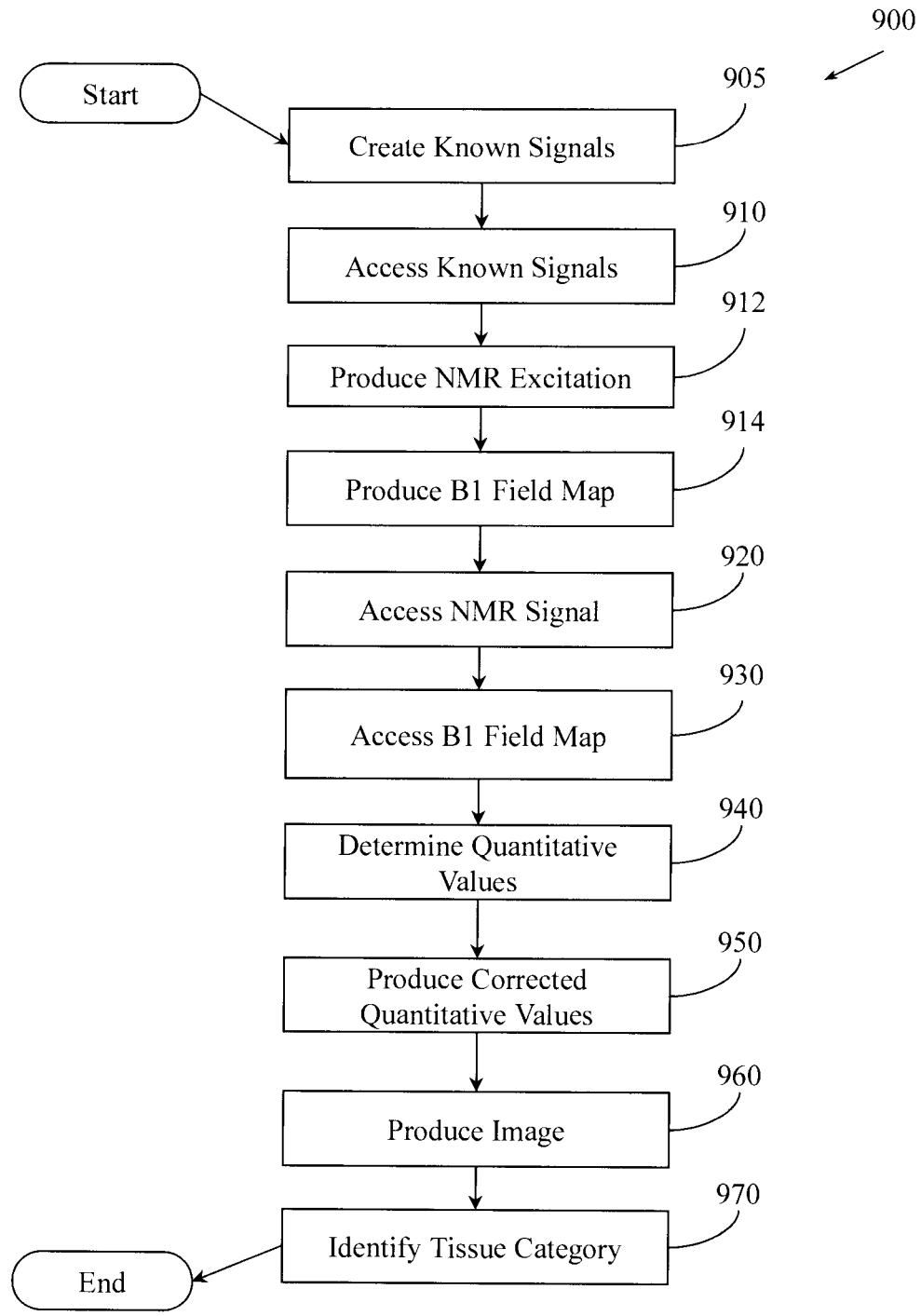
FIG. 10 illustrates an example method associated with rapid quantitative abdominal imaging using FISP-MRF.

FIG. 10 illustrates another embodiment of method 900 (FIG. 9). This embodiment includes actions 910 through 960. However, this embodiment also includes actions 905, 912, 914, and 970.

Action 905 includes creating the collection of stored entries or producing the set of known MRF signal evolutions. Producing the set of known MRF signal evolutions may include combining data associated with NMR signals associated with two or more resonant species using a weighted sum operation. In this embodiment, the inverse operation may be a matrix pseudo-inverse operation.

In one embodiment, producing the set of known MRF signal evolutions at 905 includes producing evolutions based on combinations of T1, T2, and proton density, where T1 varies in a range of 10-3000 ms, T2 varies in a range of 5-500 ms, and B1 varies in a range of 10% to 200% of the B1 field intended to be produced by the NMR apparatus.

In one embodiment, producing the set of known MRF signal evolutions at 905 includes producing data associated with NMR signals by constraining first and second MR parameters associated with different resonant species. In one embodiment, producing the data includes varying a first MR parameter associated with a first resonant species contributing to the NMR signals while holding constant a second MR parameter associated with a second resonant species contributing to the NMR signals. In one embodiment, holding a parameter constant may include allowing the parameter to vary within a tight range (e.g., 1%, 5%) around a central value. The parameters may include T1 and T2. The first resonant species may include, for example, cells found in a human abdomen. The cells may be, for example, healthy cells or diseased cells. The second resonant species may include, for example, water or fluids found in a human abdomen.

In one embodiment, producing the set of known MRF signal evolutions may include producing data associated with models of signal evolutions by holding T1 and T2 constant for a first resonant species, holding T1 and T2 constant for a second resonant species, holding T2 constant for a third resonant species, and varying T1 for the third resonant species. More generally, there may be X parameters for each of Y resonant species. All Y resonant species have the same X parameters. Producing the set of known MRF signal evolutions may include fixing one of the X parameters and sweeping through or varying other of the X parameters. In one embodiment, all the other X parameters may be varied while in another embodiment a subset of interesting X parameters may be varied.

Action 912 includes controlling the MRF apparatus to produce the MRF excitation using a FISP-MRF pulse sequence. Producing the MRF excitation is performed by applying RF energy to the volume in the object in a series of variable sequence blocks. Recall that an MRF sequence block includes one or more excitation phases, one or more readout phases, and one or more waiting phases. Recall also that at least one member of the series of variable sequence blocks differs from at least one other member of the series of variable sequence blocks in one or more sequence block parameters. Example FISP-MRF pulse sequences are illustrated in FIGS. 11-14.

In one embodiment, action 912 includes controlling the NMR apparatus to vary a flip angle associated with the MRF pulse sequence or to vary the acquisition period in the MRF pulse sequence. In one embodiment, the flip angle may be varied in a range from 0 to 54 degrees. In one embodiment, the acquisition time may be varied in a range from 6.1 ms to 9.0 ms. Other ranges of flip angles and acquisition times may be employed. The flip angles and acquisition times may be varied randomly or pseudo-randomly within the ranges.

Action 912 may also include varying other sequence block parameters including, but not limited to, echo time, phase encoding, diffusion encoding, flow encoding, RF pulse amplitude, RF pulse phase, number of RF pulses, type of gradient applied between an excitation portion of a sequence block and a readout portion of a sequence block, number of gradients applied between an excitation portion of a sequence block and a readout portion of a sequence block, an amount by which a gradient is unbalanced when applied between an excitation portion of a sequence block and a readout portion of a sequence bock, a type of gradient applied between a readout portion of a sequence block and an excitation portion of a sequence block, a number of gradients applied between a readout portion of a sequence block and an excitation portion of a sequence block, an amount by which a gradient is unbalanced when applied between a readout portion of a sequence block and an excitation portion of a sequence bock, a type of gradient applied during a readout portion of a sequence block, number of gradients applied during a readout portion of a sequence block, amount of RF spoiling, or an amount of gradient spoiling.

Action 912 may also include controlling the MRF apparatus to vary the amount of time between sequence blocks in the series of variable sequence blocks, the relative amplitude of RF pulses in sequence blocks in the series of variable sequence blocks, or the relative phase of RF pulses in sequence blocks in the series of variable sequence blocks.

Method 900 also includes, at 914, producing the B1 field map. In one embodiment, the B1 field map may be produced and acquired using a Bloch-Seigert method. In one embodiment, the B1 field map may be acquired using a spiral readout. In one embodiment, the spiral readout may be a central-out spiral readout. In one embodiment, the B1 field map is acquired in less than two seconds.

In one embodiment, method 900 also includes, at 970, identifying the volume as containing tissue that is a member of a tissue category. The tissue category may be selected based, at least in part, on the quantitative data concerning the resonant species in the volume. In one embodiment, the tissue category may identify whether the tissue is exhibiting properties that are within an expected range or that are outside the expected range.

In one embodiment, the tissue category is cirrhotic liver tissue, benign liver lesion, or malignant liver lesion. In another embodiment, the tissue category is renal tissue functioning above a threshold level or renal tissue functioning below a threshold level.

Figure 11:
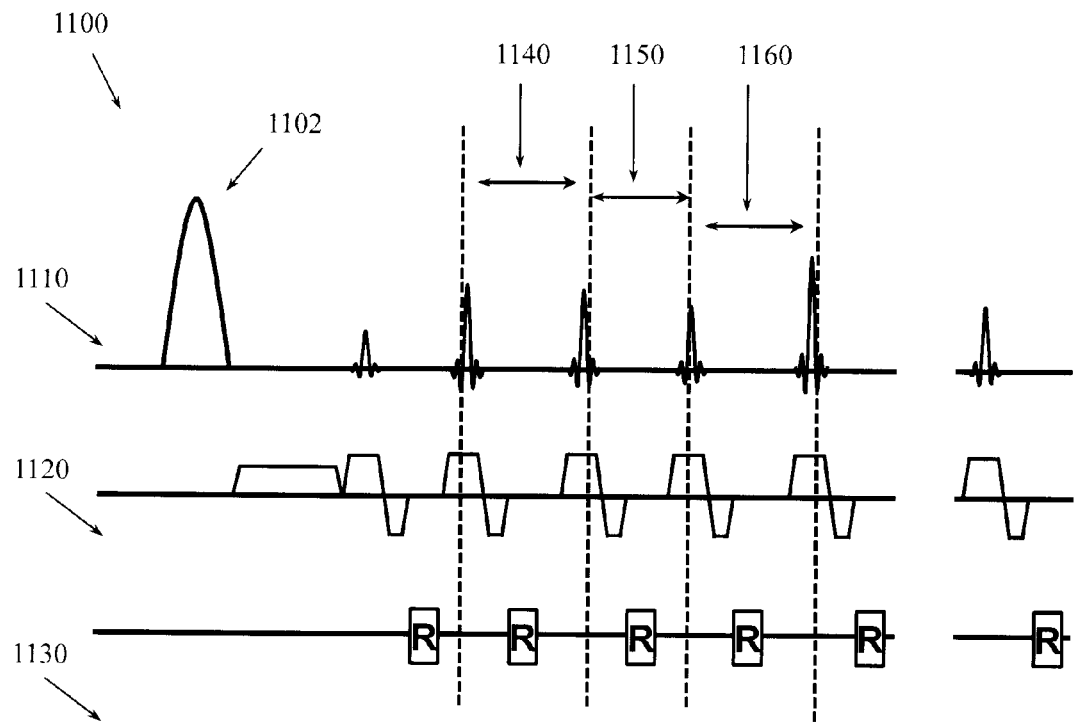
FIG. 11 illustrates an example FISP-MRF pulse sequence.

FIG. 11 illustrates an example MRF-FISP pulse sequence 1100. The MRF-FISP pulse sequence 1100 includes an RF inversion pulse 1102 in the RF energy 1110 applied. While an inversion pulse 1102 is illustrated, in different embodiments there may or may not be an inversion recovery period. The MRF-FISP pulse sequence 1100 includes an unbalanced slice select gradient 1120. While slice select gradient 1120 is illustrated as being unbalanced, in different embodiments other gradients (e.g., x, y, z, phase encoding, frequency encoding, readout encoding) may be unbalanced. The unbalanced slice select gradient 1120 dephases transverse magnetization produced during MRF of the object. In one embodiment, other than T2 or T2* decay, only the unbalanced slice select gradient 1120 dephases the transverse magnetization. Controlling the dephasing of transverse magnetization in this manner improves immunity to artifacts or other distortions caused by an imperfect B0. In the MRF-FISP pulse sequence 1100, the acquisition periods 1140, 1150, and 1160 do not have to be of equal duration. However, in one embodiment, the acquisition periods 1140, 1150, and 1160 will be equal.

The MRF-FISP algorithm can be manipulated to generate different contrasts by varying flip angles or acquisition periods used in the MRF-FISP pulse sequence 1100. Thus, in one embodiment, to generate unique signal shapes for different tissue types that may be examined using MRF-FISP, example apparatus and methods may vary flip angle or acquisition time in different acquisition periods. In one embodiment, a flip angle or acquisition time may be varied from one acquisition period to the next.

Figure 12:
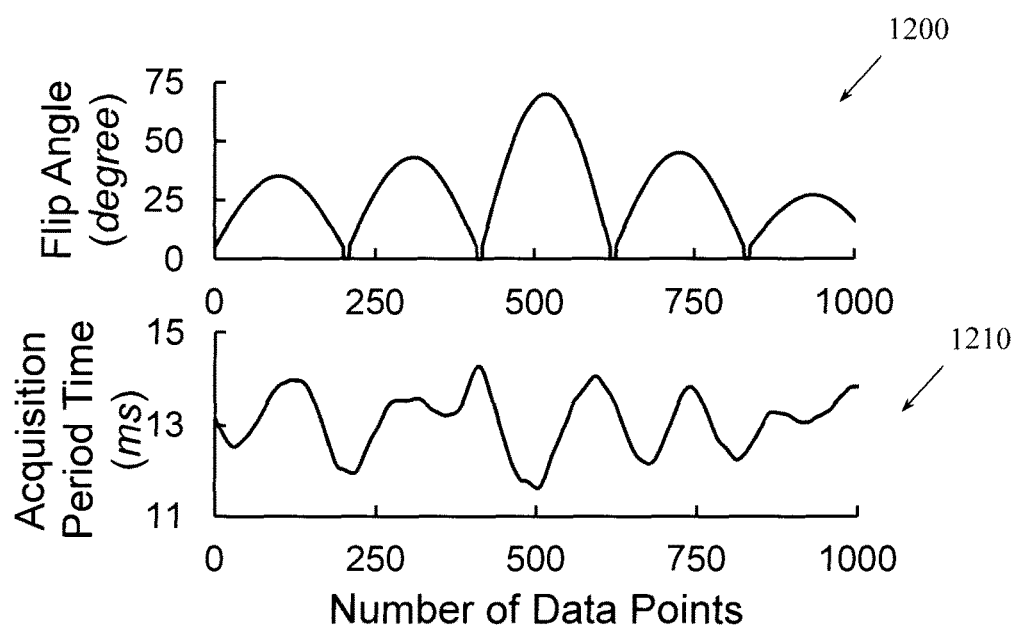
FIG. 12 illustrates flip angles and acquisition time periods associated with an example FISP-MRF pulse sequence.

FIG. 12 illustrates one example manipulation of flip angle 1200 and acquisition time 1210 in an example MRF-FISP pulse sequence. In one embodiment, a sinusoidal variation of flip angles and acquisition times per acquisition period may be employed in a Perlin noise pattern.

The unbalanced gradient 1120 illustrated in pulse sequence 1100 (FIG. 11), combined with the variations in flip angle 1200 and acquisition period 1210 illustrated in FIG. 12 produced 2π dephasing within one voxel. Achieving 2π dephasing or more within one voxel makes data acquired using the MRF-FISP sequence insensitive to B0 inhomogeneity. While 2π dephasing is described, other dephasing (e.g., 8π) may be employed.

Figure 13:
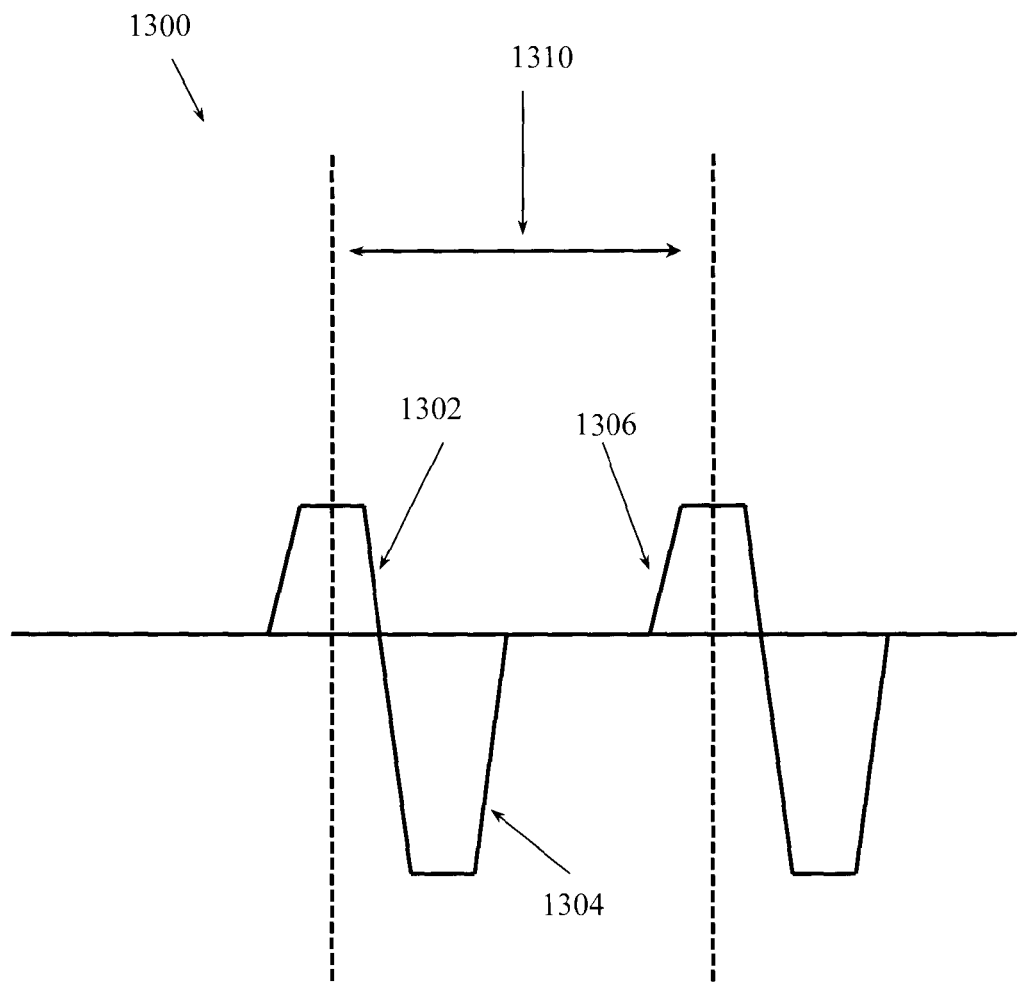
FIG. 13 illustrates a portion of an example FISP-MRF pulse sequence.

FIG. 13 illustrates a portion of an MRF-FISP pulse sequence 1300. One acquisition period 1310 is illustrated. The area 1302 usually cancels the area 1304 leaving the area 1306 as residual.

Figure 14:
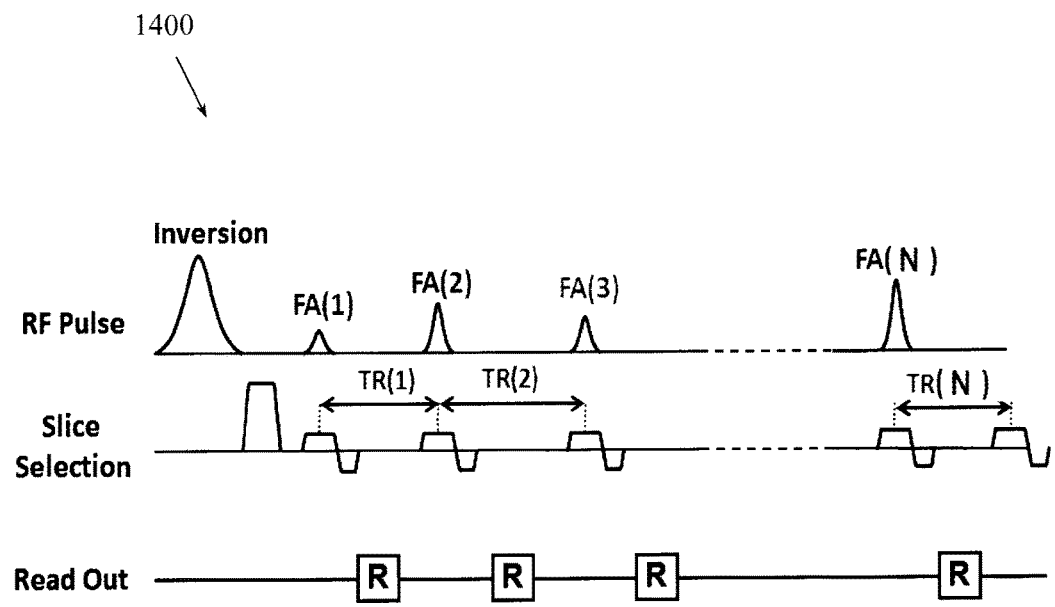
FIG. 14 illustrates an example FISP-MRF pulse sequence.
Figure 15:
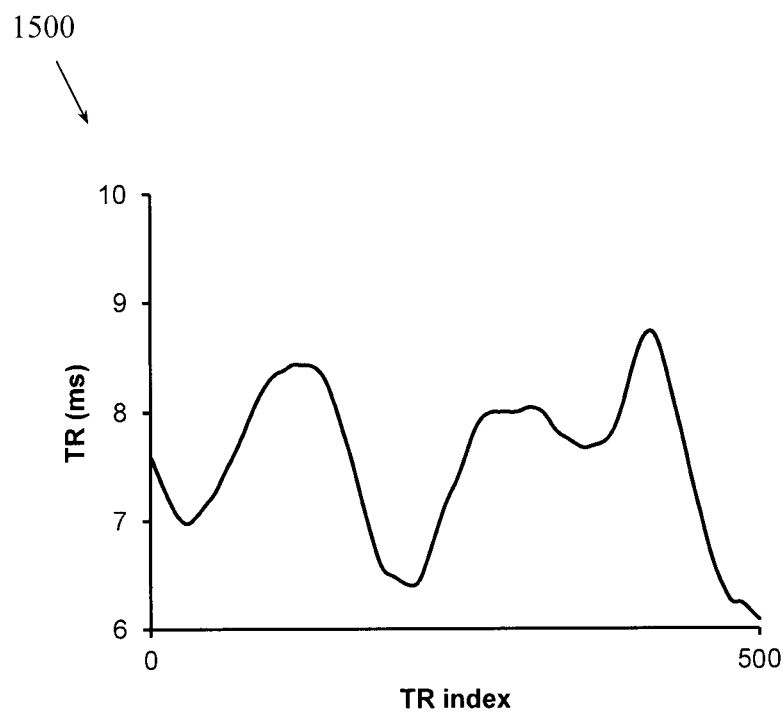
FIG. 15 illustrates an example acquisition pattern for repetition time.
Figure 16:
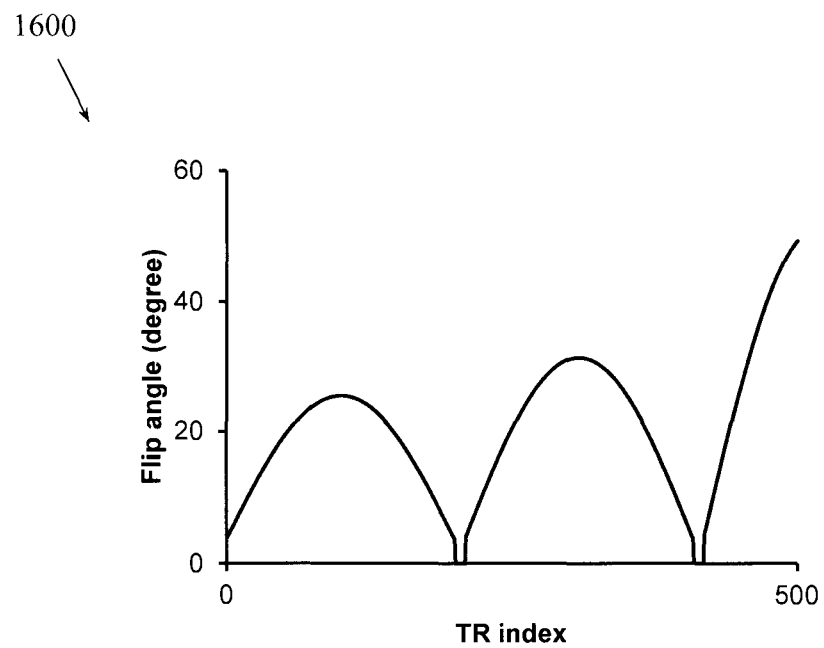
FIG. 16 illustrates an example acquisition pattern for flip angles.
Figure 17:
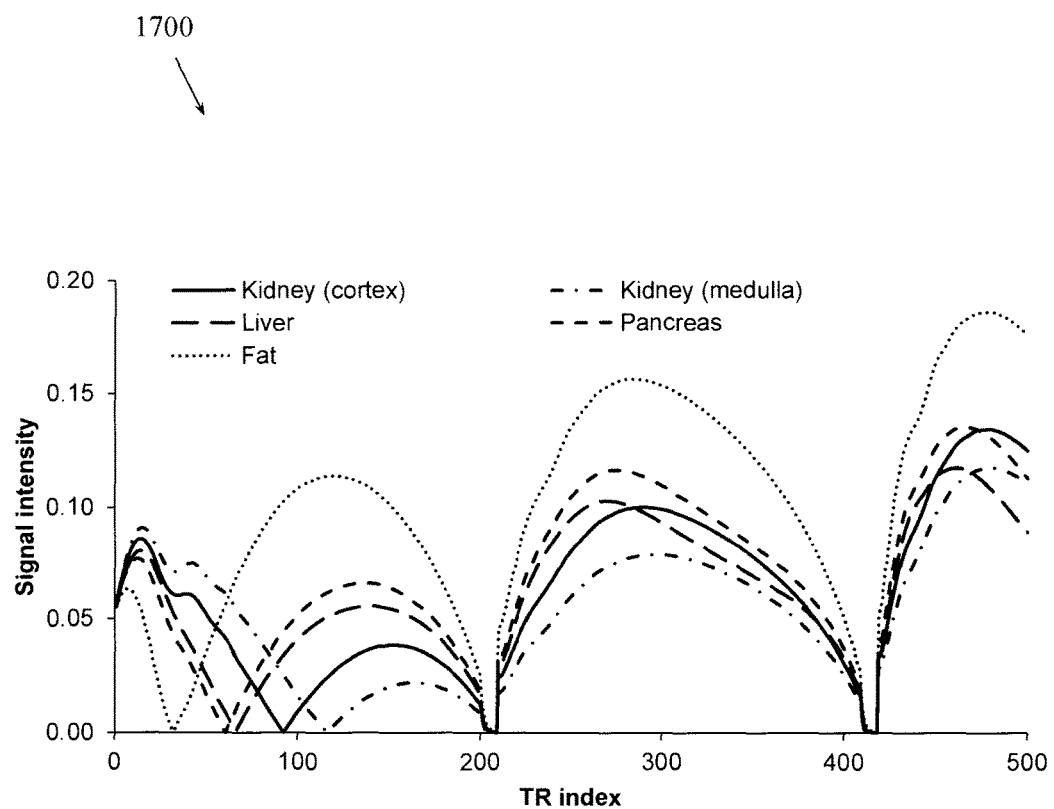
FIG. 17 illustrates simulated signal evolution curves from five different abdominal tissues.

Example apparatus and methods use FISP-MRF. FIG. 14 illustrates how an adiabatic inversion pulse is applied first, and a FISP data acquisition is applied afterwards using pseudorandomized repetition times and flip angles. One example acquisition pattern for repetition time in the FISP-MRF scan is shown in FIG. 15. One example acquisition pattern for flip angles in the FISP-MRF scan is shown in FIG. 16. In one embodiment, the repetition time may vary between 6.1 ms and 9.0 ms and the flip angle may vary between 0° and 54°. Simulated signal evolution curves from five different abdominal tissues, including hepatic parenchyma, pancreas, fat, renal cortex and medulla, that were acquired with this approach are shown in FIG. 17. Since these tissues have different characteristic T1 and T2 values, different signal evolution patterns were observed, indicating the suitability of the MRF approach to differentiate various tissue types in the abdomen.

While example systems, methods, and so on have been illustrated by describing examples, and while the examples have been described in considerable detail, it is not the intention of the applicants to restrict or in any way limit the scope of the appended claims to such detail. It is, of course, not possible to describe every conceivable combination of components or methodologies for purposes of describing the systems, methods, and so on described herein. Therefore, the invention is not limited to the specific details, the representative apparatus, and illustrative examples shown and described. Thus, this application is intended to embrace alterations, modifications, and variations that fall within the scope of the appended claims.

The following includes definitions of selected terms employed herein. The definitions include various examples and/or forms of components that fall within the scope of a term and that may be used for implementation. The examples are not intended to be limiting. Both singular and plural forms of terms may be within the definitions.

References to "one embodiment", "an embodiment", "one example", "an example", and so on, indicate that the embodiment(s) or example(s) so described may include a particular feature, structure, characteristic, property, element, or limitation, but that not every embodiment or example necessarily includes that particular feature, structure, characteristic, property, element or limitation. Furthermore, repeated use of the phrase "in one embodiment" does not necessarily refer to the same embodiment, though it may.

"Computer-readable storage medium", as used herein, refers to a non-transitory medium that stores signals, instructions and/or data. A computer-readable medium may take forms, including, but not limited to, non-volatile media, and volatile media. Non-volatile media may include, for example, optical disks, magnetic disks, and so on. Volatile media may include, for example, semiconductor memories, dynamic memory, and so on. Common forms of a computer-readable medium may include, but are not limited to, a floppy disk, a flexible disk, a hard disk, a magnetic tape, other magnetic medium, an ASIC, a CD, other optical medium, a RAM, a ROM, a memory chip or card, a memory stick, and other media from which a computer, a processor or other electronic device can read.

"Logic", as used herein, includes but is not limited to hardware, firmware, software in execution on a machine, and/or combinations of each to perform a function(s) or an action(s), and/or to cause a function or action from another logic, method, and/or system. Logic may include a software controlled microprocessor, a discrete logic (e.g., ASIC), an analog circuit, a digital circuit, a programmed logic device, a memory device containing instructions, and so on. Logic may include one or more gates, combinations of gates, or other circuit components. Where multiple logical logics are described, it may be possible to incorporate the multiple logical logics into one physical logic. Similarly, where a single logical logic is described, it may be possible to distribute that single logical logic between multiple physical logics.

An "operable connection", or a connection by which entities are "operably connected", is one in which signals, physical communications, and/or logical communications may be sent and/or received. An operable connection may include a physical interface, an electrical interface, and/or a data interface. An operable connection may include differing combinations of interfaces and/or connections sufficient to allow operable control. For example, two entities can be operably connected to communicate signals to each other directly or through one or more intermediate entities (e.g., processor, operating system, logic, software). Logical and/or physical communication channels can be used to create an operable connection.

"User", as used herein, includes but is not limited to one or more persons, software, computers or other devices, or combinations of these.

To the extent that the term "includes" or "including" is employed in the detailed description or the claims, it is inclusive in a manner similar to the term "comprising" as that term is interpreted when employed as a transitional word in a claim.

To the extent that the term "or" is employed in the detailed description or claims (e.g., A or B) it means "A or B or both". When the applicants intend to indicate "only A or B but not both" then the term "only A or B but not both" will be employed. Thus, use of the term "or" herein is the inclusive, and not the exclusive use. See, Bryan A. Garner, A Dictionary of Modern Legal Usage 624 (2d. Ed. 1995).

To the extent that the phrase "one of, A, B, and C" is employed herein, (e.g., a data store configured to store one of, A, B, and C) it conveys the set of possibilities A, B, and C, (e.g., the data store may store only A, only B, or only C). It is not intended to require one of A, one of B, and one of C. When the applicants intend to indicate "at least one of A, at least one of B, and at least one of C", then the phrasing "at least one of A, at least one of B, and at least one of C" will be employed.

To the extent that the phrase "one or more of, A, B, and C" is employed herein, (e.g., a data store configured to store one or more of, A, B, and C) it conveys the set of possibilities A, B, C, AB, AC, BC, ABC, AA . . . A, BB . . . B, CC . . . C, AA . . . ABB . . . B, AA . . . ACC . . . C, BB . . . BCC . . . C, or AA . . . ABB . . . BCC . . . C (e.g., the data store may store only A, only B, only C, A&B, A&C, B&C, A&B&C, or other combinations thereof including multiple instances of A, B, or C). It is not intended to require one of A, one of B, and one of C. When the applicants intend to indicate "at least one of A, at least one of B, and at least one of C", then the phrasing "at least one of A, at least one of B, and at least one of C" will be employed.

What is claimed is:

1. A method for performing magnetic resonance fingerprinting (MRF) using a nuclear magnetic resonance (NMR) apparatus, the method comprising:
accessing a set of known magnetic resonance fingerprinting (MRF) signal evolutions;
acquiring, using the NMR apparatus, nuclear magnetic resonance (NMR) signals produced by a volume by applying radio frequency (RF) energy to the volume according to a fast imaging with steady-state free precession (FISP) MRF pulse sequence to cause one or more resonant species in the volume to simultaneously produce individual NMR signals in response to the FISP MRF pulse sequence;
creating a B1 field map that characterizes a B1 field in the volume using the NMR apparatus;
determining quantitative values for two or more parameters of a resonant species in a voxel in the volume based, at least in part, on matching the acquired NMR signal to the set of known MRF signal evolutions, where the two or more parameters include T1, T2, and proton density, T1 being spin-lattice relaxation, T2 being spin-spin relaxation;
producing corrected quantitative values from the quantitative values based, at least in part, on the B1 field map, and
producing an image of at least a portion of the volume based, at least in part, on the corrected quantitative values.

2. The method of claim 1, where the volume is located in a human abdomen.

3. The method of claim 2 further comprising:
controlling the NMR apparatus to perform, in less than twenty seconds, creating and acquiring the B1 field map, applying the FISP-MRF pulse sequence, acquiring the NMR signal, and producing the image.

4. The method of claim 1, where the set of known MRF signal evolutions includes signal evolutions based on combinations of T1, T2, and proton density, where T1 varies in a range of 10-3000 ms, T2 varies in a range of 5-500 ms, and B1 varies in a range of 10% to 200% of the B1 field intended to be produced by the NMR apparatus.

5. The method of claim 1 further comprising:
controlling the NMR apparatus to apply the FISP-MRF pulse sequence with random repetition times.

6. The method of claim 1 further comprising:
controlling the NMR apparatus to apply the FISP-MRF pulse sequence with random flip angles.

7. The method of claim 1 further comprising:
controlling the NMR apparatus to apply the FISP-MRF pulse sequence with random repetition times and random flip angles.

8. The method of claim 1 further comprising:
controlling the NMR apparatus to apply the FISP-MRF pulse sequence with pseudo-random repetition times that vary within a range of 6.0 ms to 9.0 ms.

9. The method of claim 1 further comprising:
controlling the NMR apparatus to apply the FISP-MRF pulse sequence with pseudo-random flip angles that vary within a range of 0 to 54 degrees.

10. The method of claim 1 further comprising:
controlling the NMR apparatus to apply the FISP-MRF pulse sequence with pseudo-random repetition times that vary within a range of 6.0 ms to 9.0 ms and pseudo-random flip angles that vary within a range of 0 to 54 degrees.

11. The method of claim 1 further comprising:
acquiring the B1 field map using a Bloch-Seigert method.

12. The method of claim 11 further comprising:
acquiring the B1 field map using a spiral readout.

13. The method of claim 12, where the spiral readout is a central-out spiral readout.

14. The method of claim 11 further comprising:
acquiring the B1 field map in less than two seconds.

15. The method of claim 1, where producing the image includes performing a reconstruction on the corrected quantitative values using a non-uniform fast Fourier transform (NUFFT).

16. The method of claim 11, where the reconstruction is performed using one spiral interleave.

17. The method of claim 1, where the acquired NMR signal is associated with one of at least one thousand under-sampled images acquired in less than twenty seconds at an under-sampling rate of at least 12.

18. The method of claim 1, where the acquired NMR signal is associated with one of at least one thousand under-sampled images acquired in less than fifteen seconds at an under-sampling rate of at least 24.

19. The method of claim 1, where the acquired NMR signal is associated with one of at least one thousand under-sampled images acquired in less than ten seconds at an under-sampling rate of at least 48.

20. The method of claim 1 further comprising:
identifying the volume as containing tissue that is a member of a tissue category based, at least in part, on the corrected quantitative values, and
providing information concerning the tissue category.

21. The method of claim 20, where the tissue category is one of, tissue exhibiting quantitative values within a range, and tissue exhibiting quantitative values outside the range.

22. The method of claim 20, where the tissue category is one of, cirrhotic liver tissue, benign liver lesion, and malignant liver lesion.

23. The method of claim 20, where the tissue category is one of renal tissue functioning above a threshold level and renal tissue functioning below a threshold level.

24. The method of claim 1, the method comprising producing the set of known MRF signal evolutions.

25. The method of claim 24, where producing the set of known MRF signal evolutions includes producing signal evolutions based on combinations of T1, T2, and proton density, where T1 varies in a range of 10-3000 ms, T2 varies in a range of 5-500 ms, and B1 varies in a range of 10% to 200% of the B1 field intended to be produced by the NMR apparatus.

26. The method of claim 1 further comprising:
controlling the NMR apparatus to produce the MRF excitation using the FISP-MRF pulse sequence by applying radio frequency (RF) energy to the volume in a series of variable sequence blocks, where a sequence block includes one or more excitation phases, one or more readout phases, and one or more waiting phases,
where the RF energy applied during a sequence block causes the one or more resonant species in the volume to simultaneously produce individual NMR signals, and
where at least one member of the series of variable sequence blocks differs from at least one other member of the series of variable sequence blocks, and
controlling the NMR apparatus to acquire the simultaneously produced individual NMR signals.

27. The method of claim 26, where the sequence block parameters include echo time, flip angle, phase encoding, diffusion encoding, flow encoding, RF pulse amplitude, RF pulse phase, number of RF pulses, type of gradient applied between an excitation portion of a sequence block and a readout portion of a sequence block, number of gradients applied between an excitation portion of a sequence block and a readout portion of a sequence block, an amount by which a gradient is unbalanced when applied between an excitation portion of a sequence block and a readout portion of a sequence bock, a type of gradient applied between a readout portion of a sequence block and an excitation portion of a sequence block, a number of gradients applied between a readout portion of a sequence block and an excitation portion of a sequence block, an amount by which a gradient is unbalanced when applied between a readout portion of a sequence block and an excitation portion of a sequence bock, a type of gradient applied during a readout portion of a sequence block, a number of gradients applied during a readout portion of a sequence block, an amount of RF spoiling, or an amount of gradient spoiling.

28. The method of claim 1, where the set of known MRF signal evolutions includes signal evolutions outside the set of signal evolutions characterized by:

$$SE = A - Be^{-t/C}$$

where:
SE is a signal evolution,
A is a constant,
B is a constant,
T is time, and
C is a single relaxation parameter.

29. The method of claim 1, where the set of known MRF signal evolutions includes a signal evolution selected from a set of signal evolutions described by the MRF signal evolution equations.

30. An apparatus, comprising:
a nuclear magnetic resonance (NMR) logic that receives a first set of data from a magnetic resonance fingerprinting (MRF) apparatus that repetitively and variably samples a (k, t, E) space associated with a human abdomen to acquire a set of NMR signals,
where the MRF apparatus applies radio frequency (RF) energy to the object according to an MRF pulse sequence to cause the object to produce the set of NMR signals, the MRF pulse sequence being a fast imaging with steady-state free precession (FISP) MRF sequence,
where members of the first set of data are associated with different points in the (k, t, E) space, where t is time and E includes at least T1 and T2, T1 being spin-lattice relaxation and T2 being spin-spin relaxation, and where one or more of, t and E, vary non-linearly;
a B1 field map logic that stores data associated with a B1 field map associated with a B1 field produced by the NMR apparatus and present in the volume while the first set of data is received;
a correction logic that produces a first set of corrected data from the first set of data based, at least in part, on the B1 field map;
a signal logic that produces an NMR signal evolution from the first set of corrected data; and
a matching logic that selects, from a collection of stored MRF signal evolutions, a selected stored MRF signal evolution that matches the NMR signal evolution to within a desired tolerance,
where quantitative information about the abdomen is retrievable using the selected stored signal evolution.

31. The apparatus of claim 30, comprising:
property logic that retrieves the quantitative information and identifies the object as having a property based, at least in part, on the quantitative information,
where the property describes whether the object has resonant species exhibiting attributes that fall within a specified range.

32. A magnetic resonance imaging (MRI) apparatus, comprising:
a collection logic that collects a received signal evolution from a tissue experiencing nuclear magnetic resonance (NMR) in response to a FISP-MRF excitation applied to the tissue by the MRI apparatus;
a data store that stores a dictionary of MRF signal evolutions, where members of the dictionary are combinations of information associated with two or more resonant species, and where information concerning the composition of the tissue with respect to the two or more resonant species is retrievable using a matched signal evolution;
a B1 field map logic that acquires and stores data associated with a B1 field produced by the MRI apparatus and experienced by the tissue;
a correction logic that corrects the received signal evolution to account for an inhomogeneous B1 field using the B1 field data;
a selection logic that selects a matching member of the dictionary that is most closely related to the signal evolution and establishes the matching member as the matched signal evolution, and
a characterization logic that identifies a category for the tissue based, at least in part, on the composition of the tissue as identified using the matched signal evolution.

33. The MRI apparatus of claim 32, where the characterization logic identifies the category for the tissue using a quantitative magnetic resonance based approach.

34. The MRI apparatus of claim 33, where the category for the tissue distinguishes tissue exhibiting T1, T2, or proton density values within a specified range from tissue exhibiting T1, T2, or proton density values outside the specified range.

* * * * *